United States Patent
Xie et al.

(10) Patent No.: US 10,504,798 B2
(45) Date of Patent: Dec. 10, 2019

(54) GATE CUT IN REPLACEMENT METAL GATE PROCESS

(71) Applicant: GLOBALFOUNDRIES INC., Grand Cayman (KY)

(72) Inventors: Ruilong Xie, Schenectady, NY (US); Chanro Park, Albany, NY (US); Laertis Economikos, Wappingers Falls, NY (US); Andrew Greene, Slingerlands, NY (US); Siva Kanakasabapathy, Pleasanton, CA (US); John R. Sporre, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/897,204

(22) Filed: Feb. 15, 2018

(65) Prior Publication Data

US 2019/0252268 A1   Aug. 15, 2019

(51) Int. Cl.
| | |
|---|---|
| *H01L 21/8238* | (2006.01) |
| *H01L 21/28* | (2006.01) |
| *H01L 29/49* | (2006.01) |
| *H01L 29/66* | (2006.01) |
| *H01L 27/092* | (2006.01) |
| *H01L 29/06* | (2006.01) |

(52) U.S. Cl.
CPC ............... *H01L 21/823864* (2013.01); *H01L 21/28088* (2013.01); *H01L 21/28185* (2013.01); *H01L 21/823821* (2013.01); *H01L 21/823842* (2013.01); *H01L 21/823878* (2013.01); *H01L 27/0924* (2013.01); *H01L 29/0649* (2013.01); *H01L 29/4966* (2013.01); *H01L 29/6653* (2013.01); *H01L 29/66545* (2013.01)

(58) Field of Classification Search
CPC ....... H01L 29/66795; H01L 21/823821; H01L 21/823878
See application file for complete search history.

(56) References Cited

U.S. PATENT DOCUMENTS

| | | | |
|---|---|---|---|
| 8,703,557 B1 * | 4/2014 | Cai | ...................... H01L 29/6681 257/347 |
| 9,653,579 B2 | 5/2017 | Liu et al. | |
| 2014/0252486 A1 * | 9/2014 | Lin | ................... H01L 29/66795 257/365 |
| 2014/0319623 A1 * | 10/2014 | Tsai | ..................... H01L 29/7855 257/401 |
| 2015/0064916 A1 * | 3/2015 | Shieh | ................ H01L 29/66795 438/702 |
| 2016/0056181 A1 * | 2/2016 | Anderson | ........... H01L 27/1211 257/347 |

(Continued)

*Primary Examiner* — Samuel A Gebremariam
*Assistant Examiner* — Jonas T Beardsley
(74) *Attorney, Agent, or Firm* — Francois Pagette; Hoffman Warnick LLC

(57) ABSTRACT

Gate isolation methods and structures leverage the formation of a sidewall spacer layer within a recess formed in an organic planarization layer. The spacer layer enables precise alignment of the cut region of a sacrificial gate, which may be backfilled with an isolation layer. By forming the isolation layer after a reliability anneal of the gate dielectric and after formation of a first work function metal layer, both the desired critical dimension (CD) and alignment of the isolation layer can be achieved.

5 Claims, 19 Drawing Sheets

(56) References Cited

U.S. PATENT DOCUMENTS

2016/0133632 A1    5/2016  Park et al.
2016/0247728 A1*  8/2016  You ................. H01L 21/823821
2016/0380074 A1* 12/2016  Cheng ............... H01L 29/66545
                                                                                  438/305

* cited by examiner

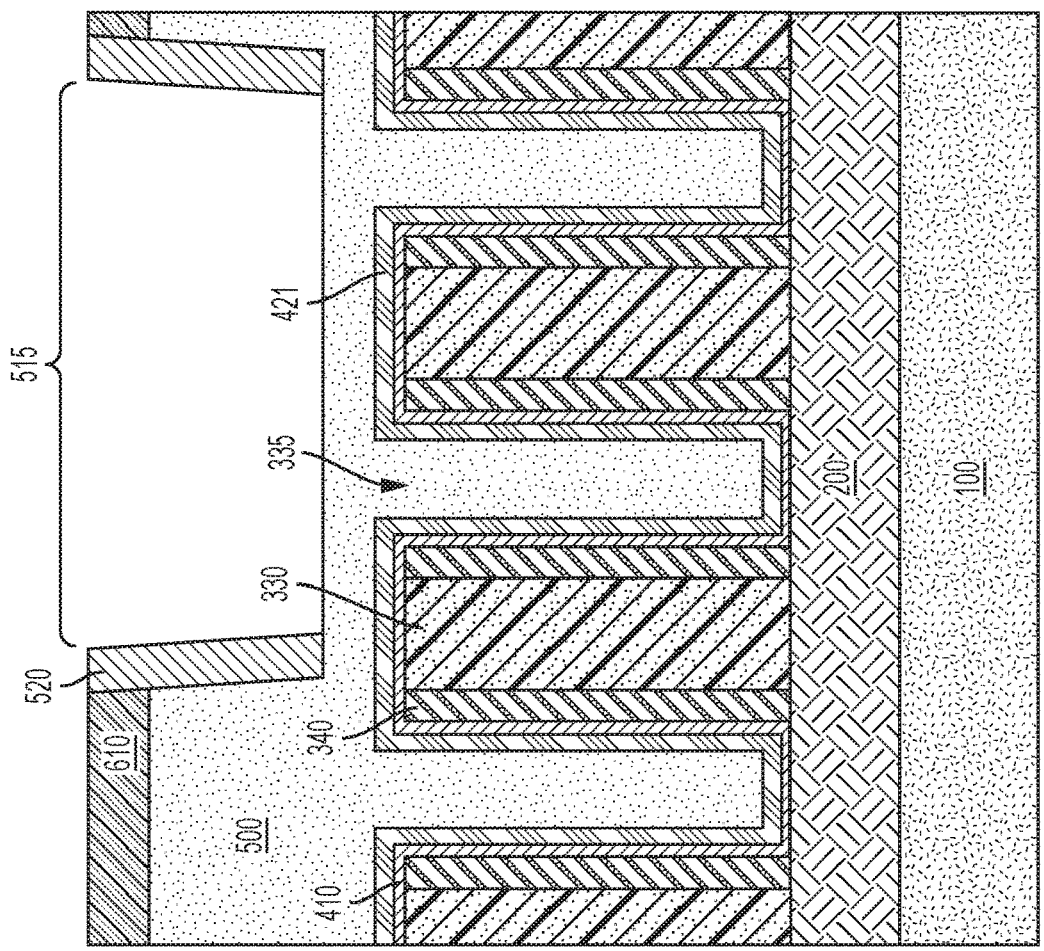
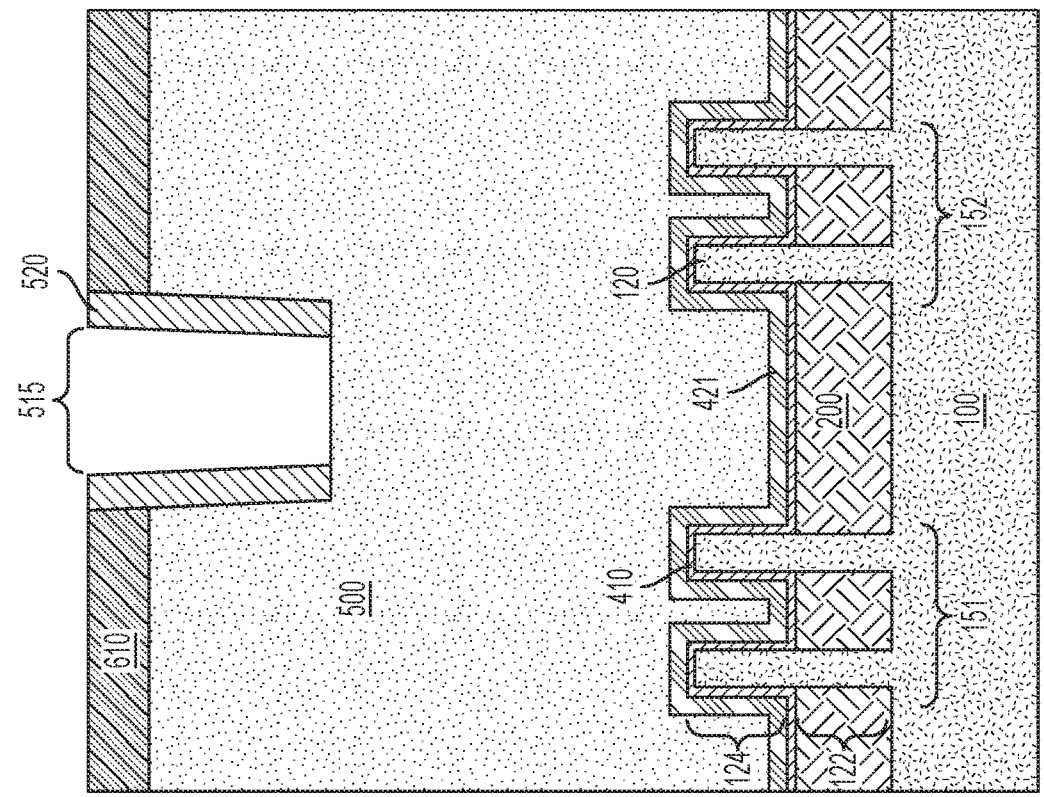
FIG. 4A
FIG. 4B

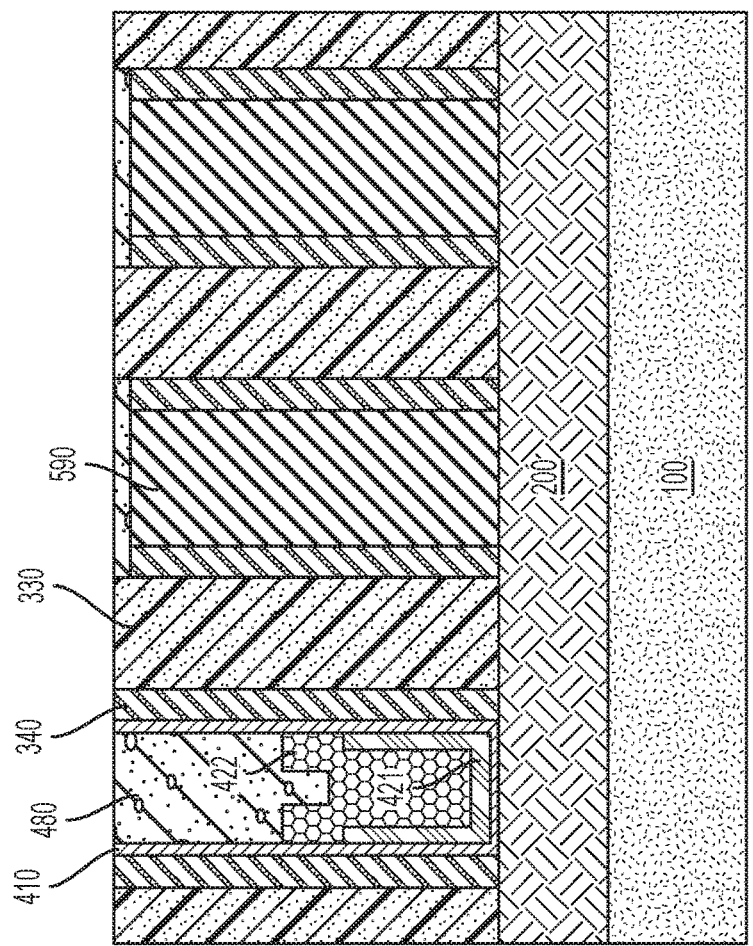
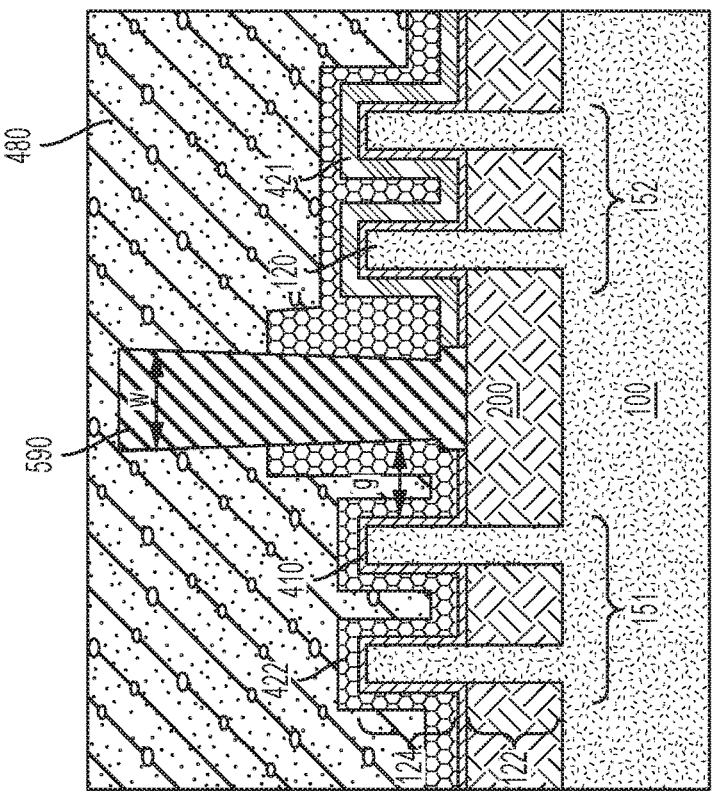
FIG. 8B
FIG. 8A

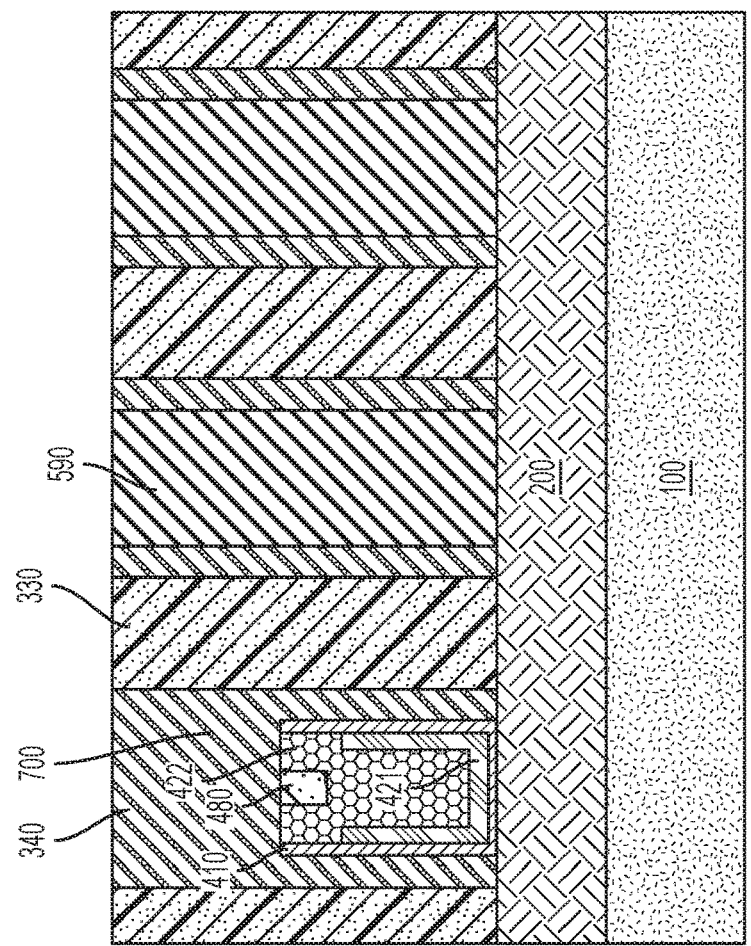
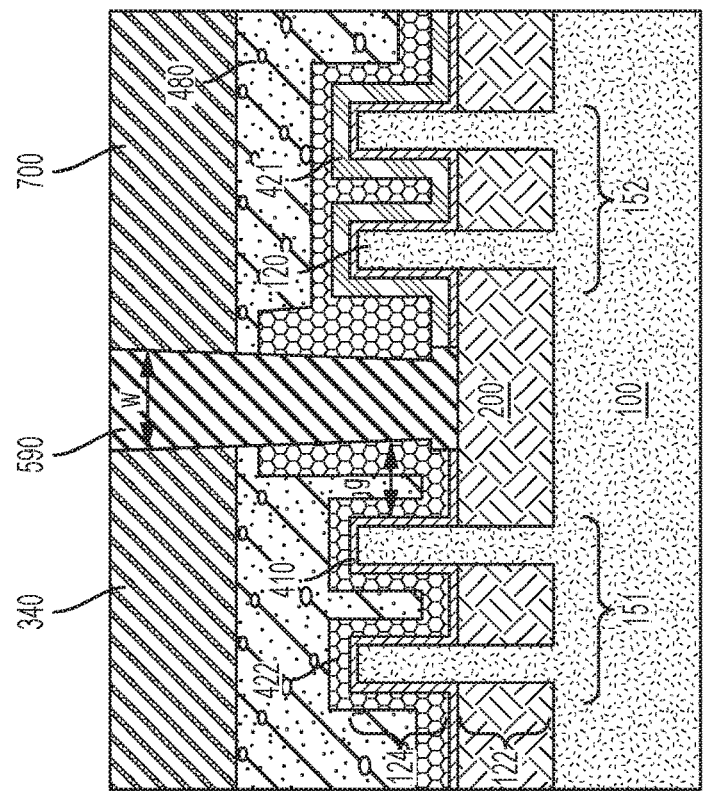
FIG. 9A
FIG. 9B

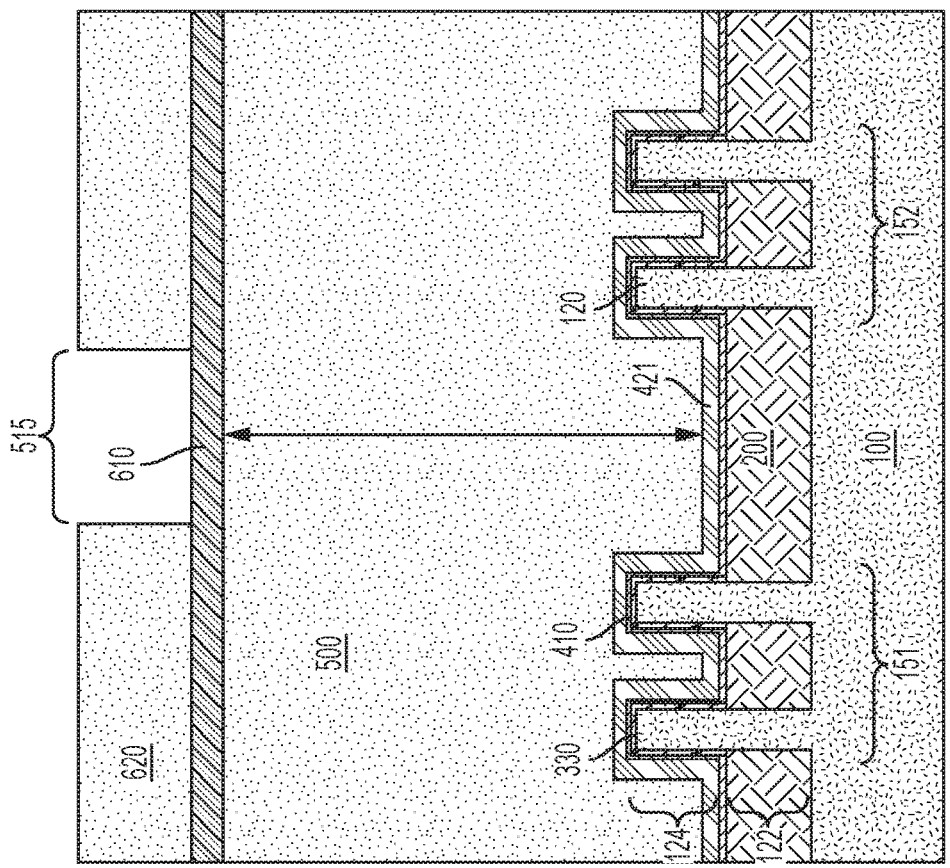
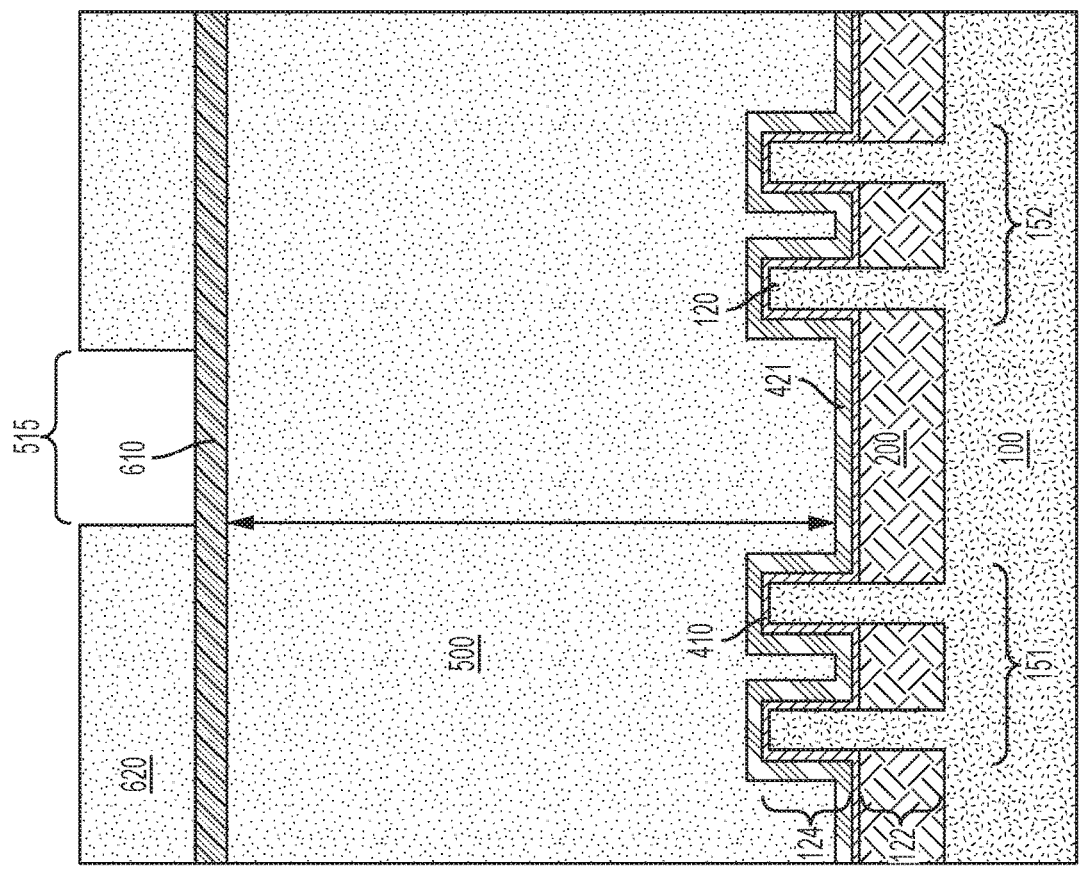

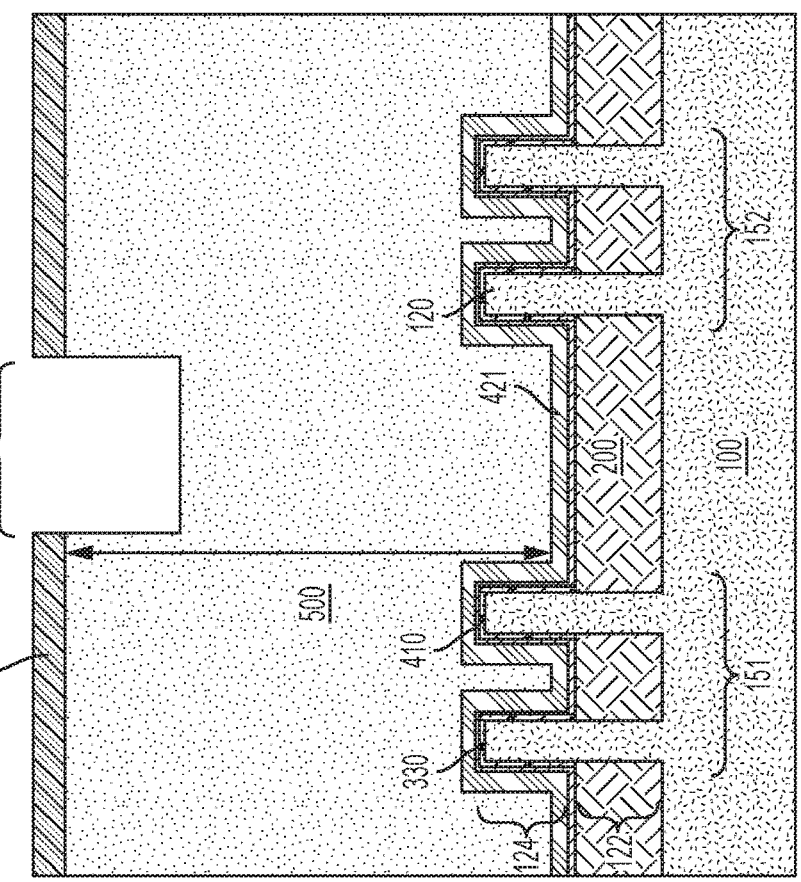
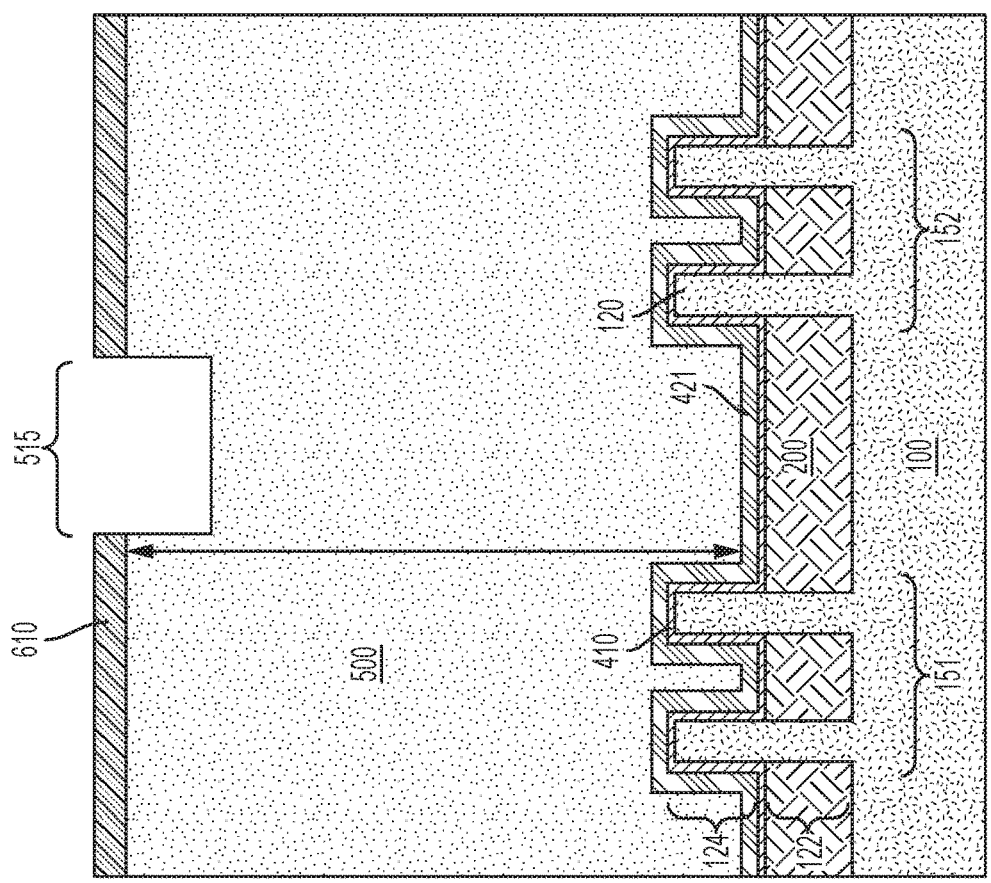
FIG. 11A
FIG. 11B

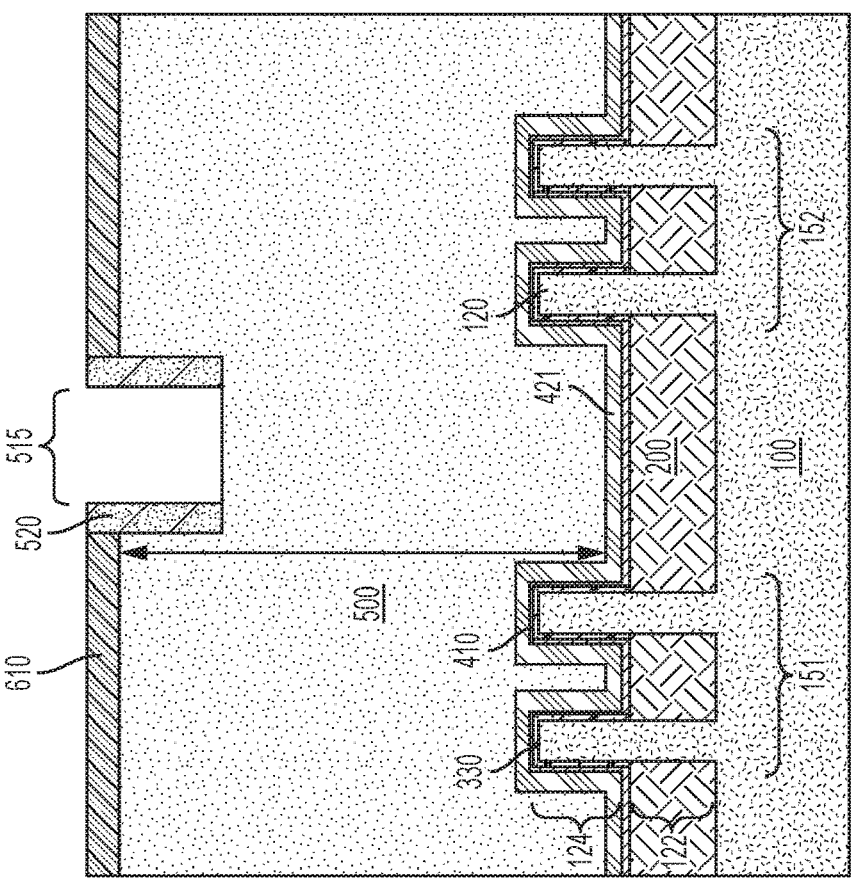
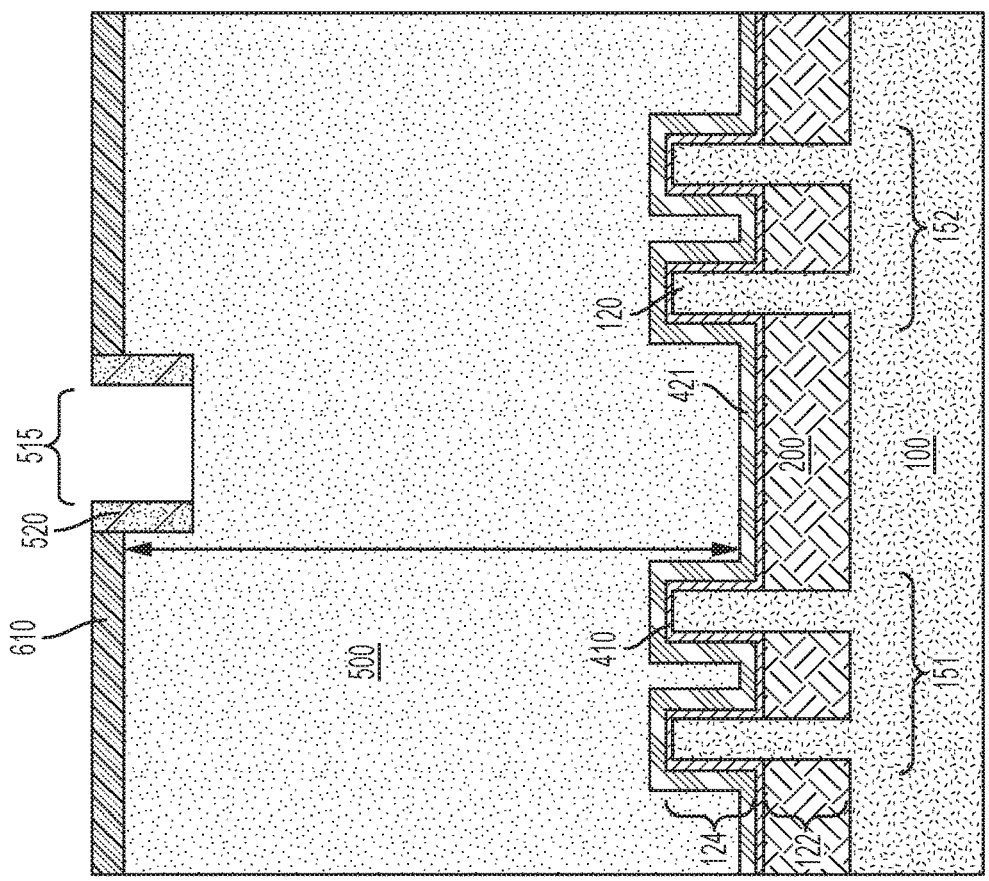
FIG. 12A
FIG. 12B

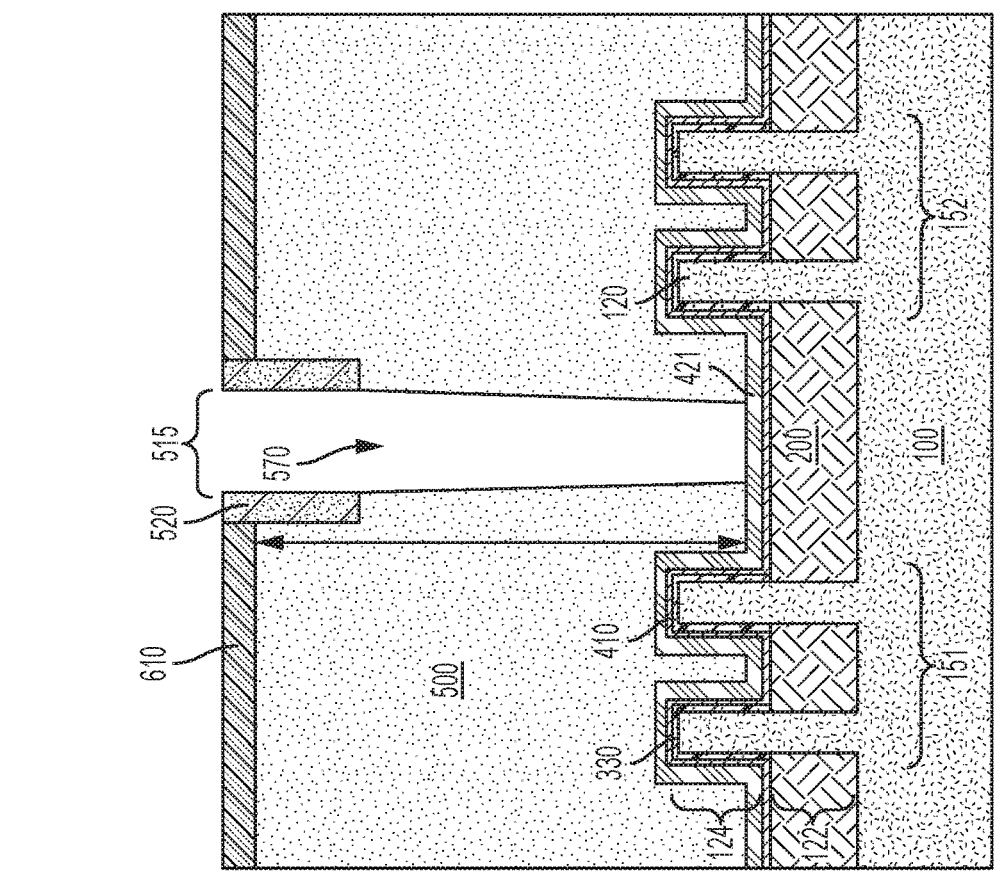
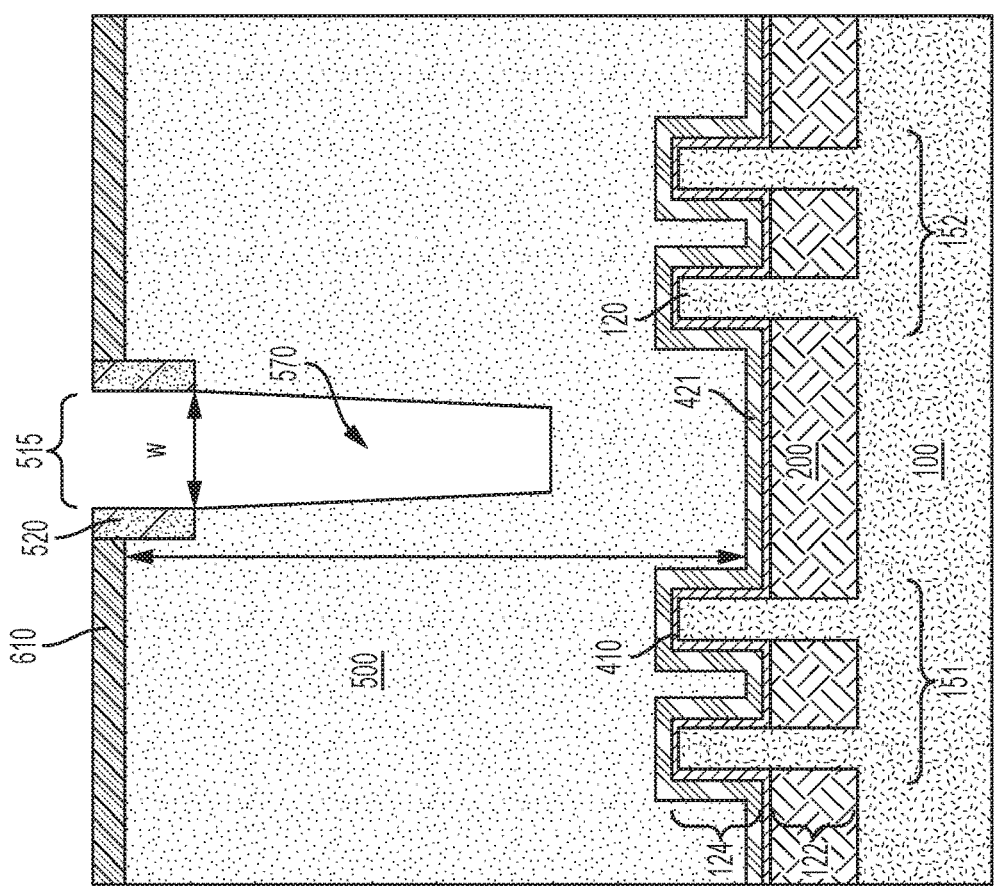

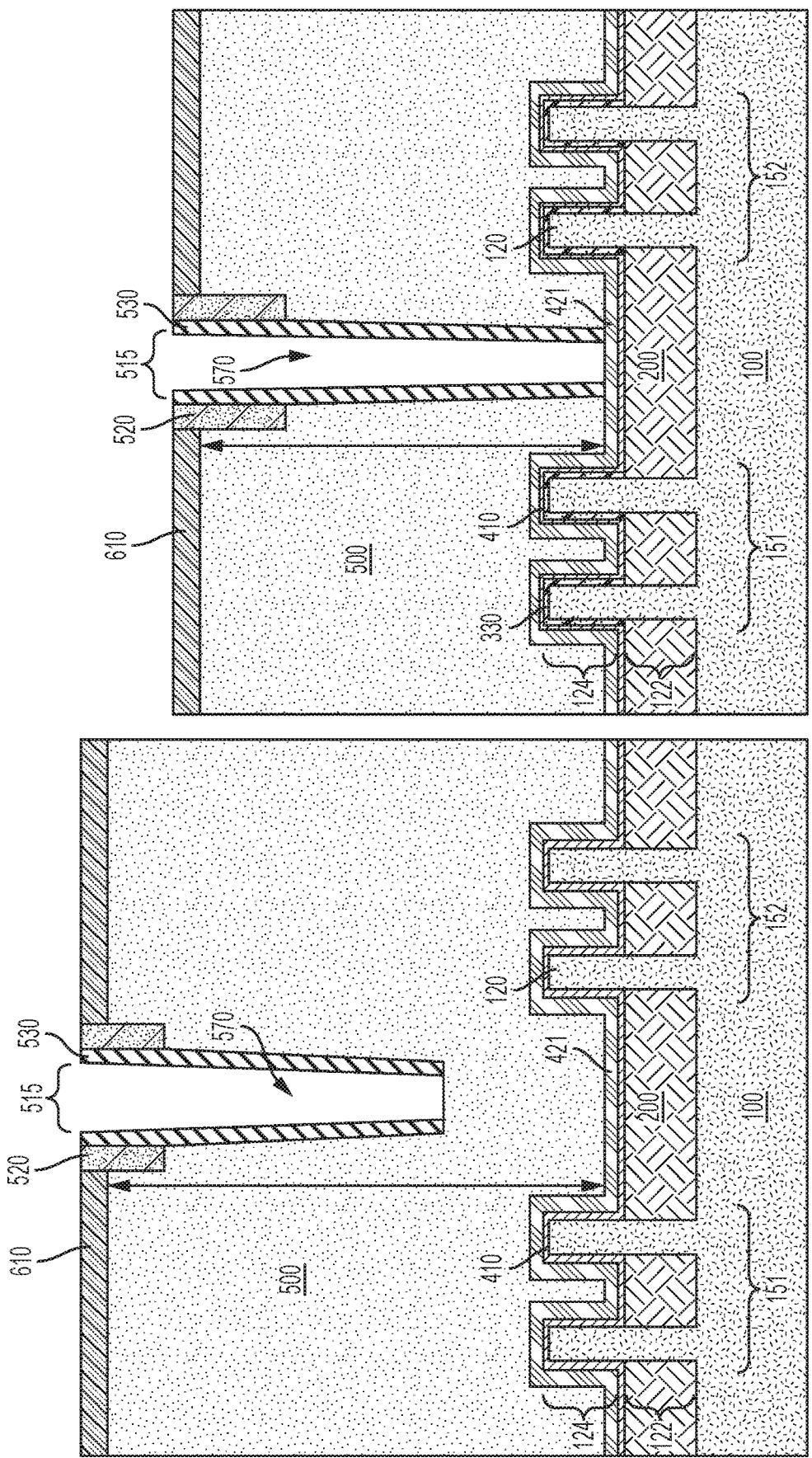

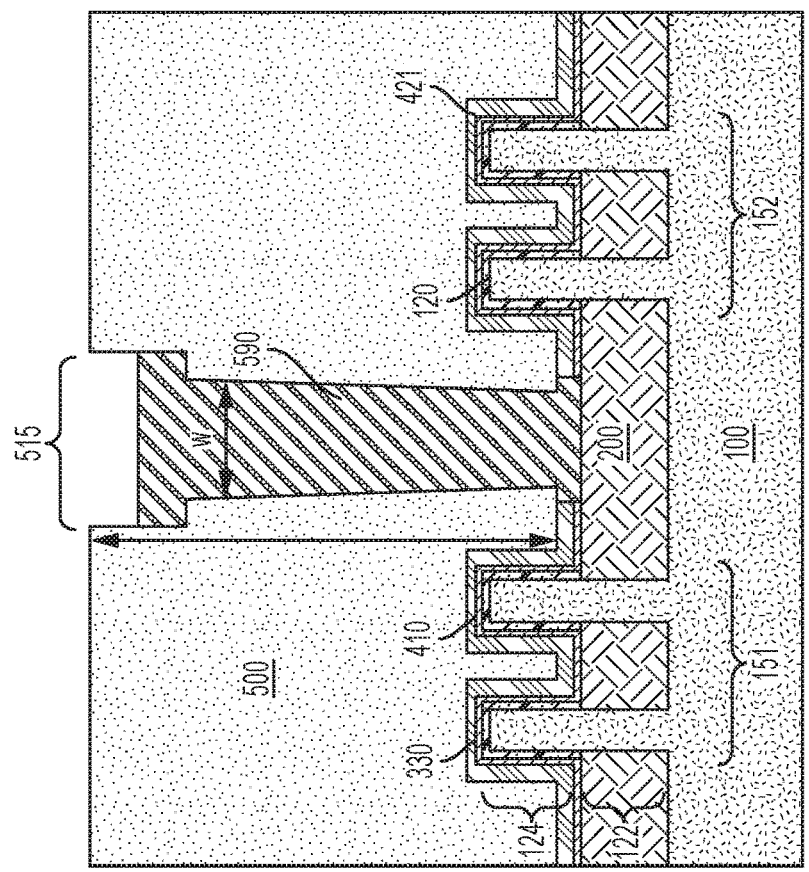
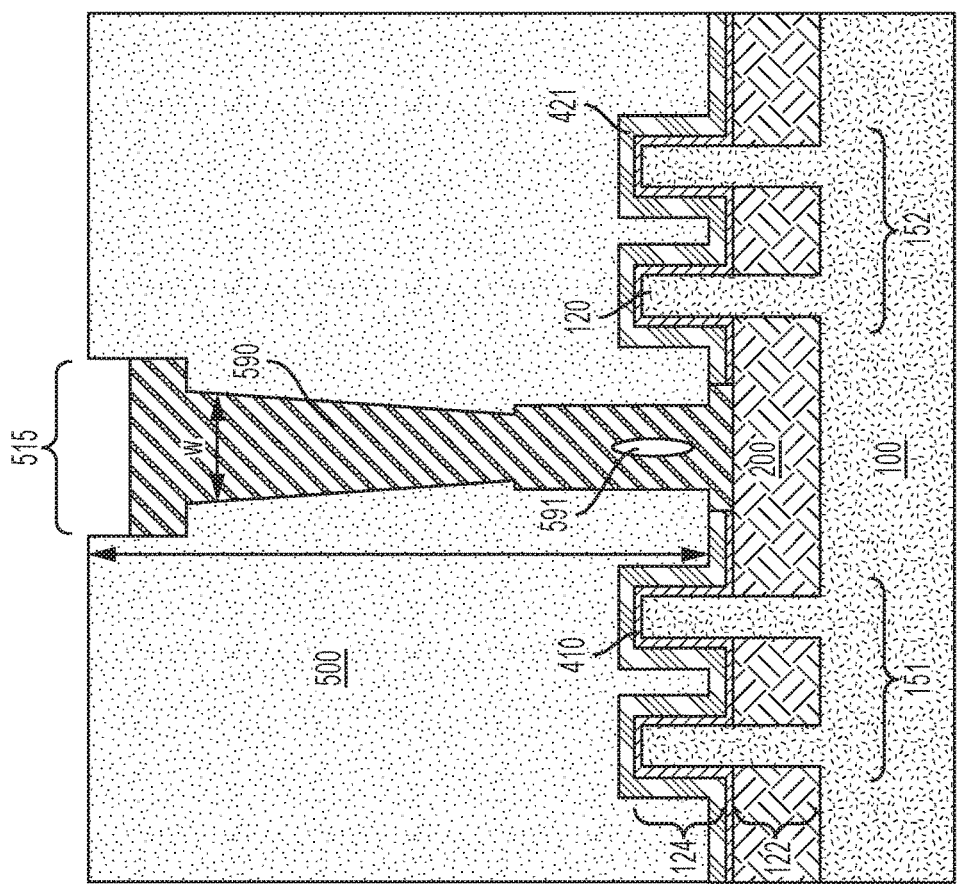
FIG. 17A
FIG. 17B

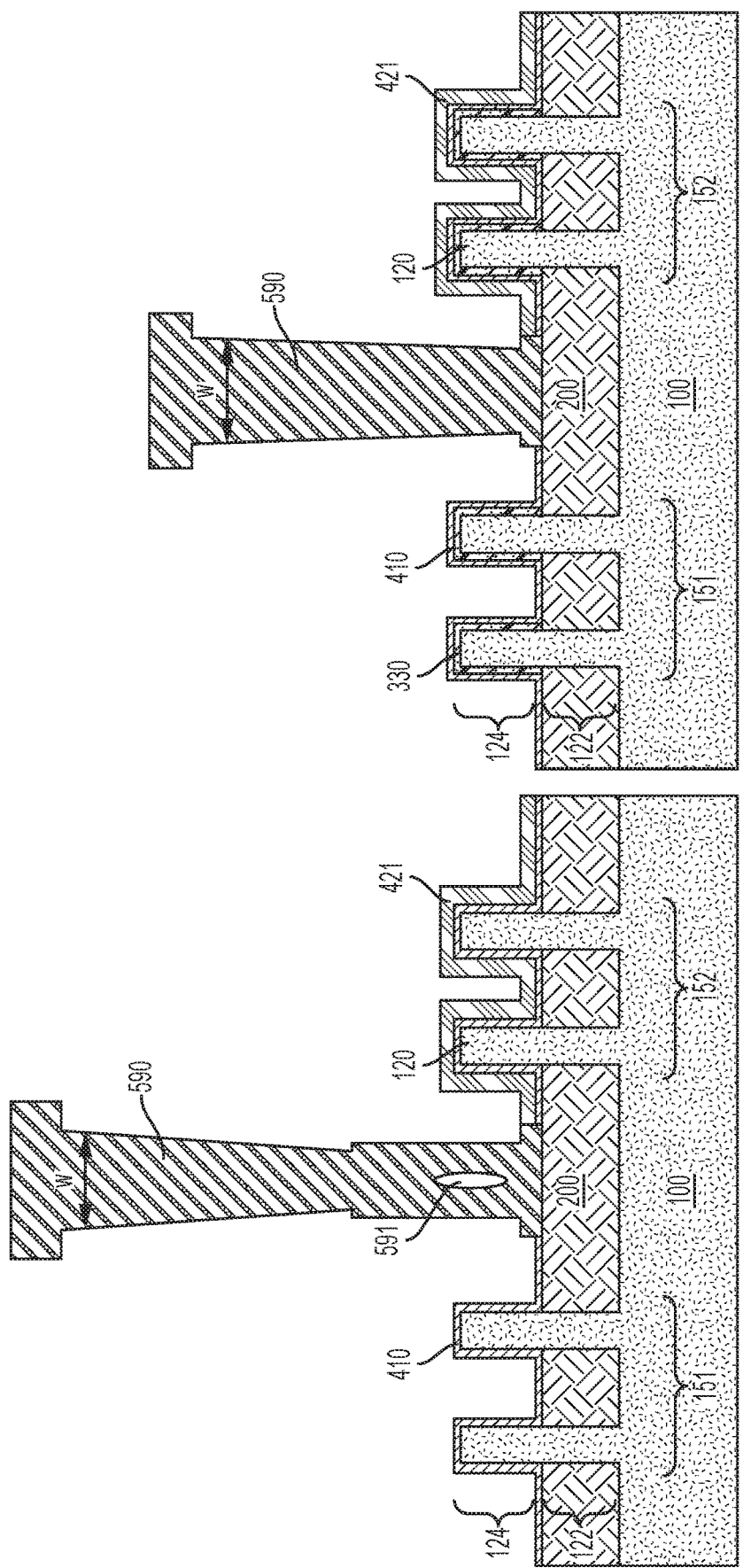

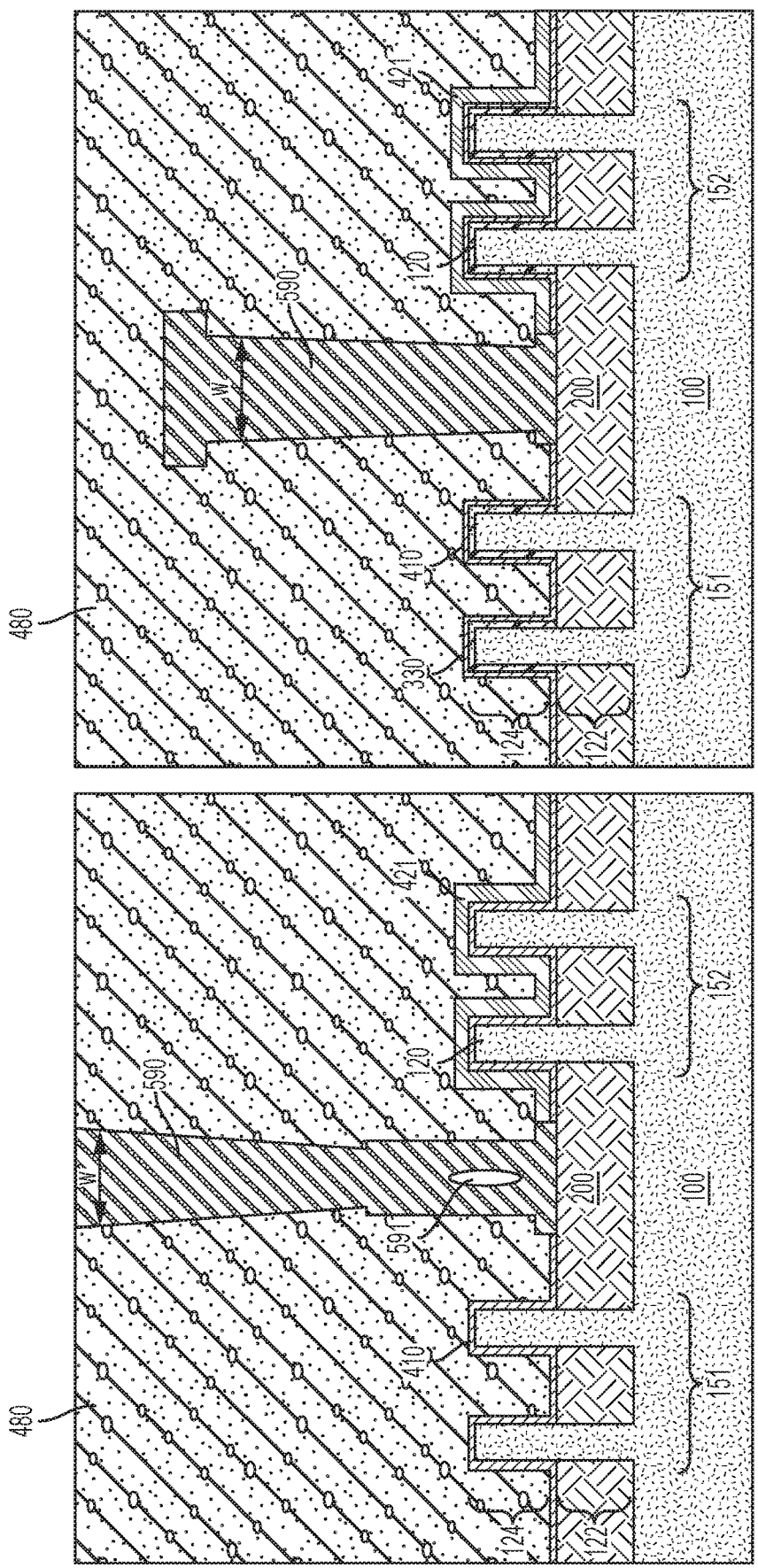

GATE CUT IN REPLACEMENT METAL GATE PROCESS

BACKGROUND

The present application relates generally to semiconductor devices, and more specifically to methods for manufacturing fin field effect transistors.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

The gate structure may be formed using a gate-first or a gate-last fabrication process. A gate-last process, such as a replacement metal gate (RMG) process, utilizes a sacrificial or dummy gate, which is typically replaced by a functional gate after device activation, i.e., after dopant implantation into source/drain regions of the fins and an associated drive-in anneal, in order to avoid exposing the functional gate materials to the thermal budget associated with activation.

Prior to removing the sacrificial gate and forming a functional gate, a gate cut module may be used to sever (i.e., segment) the sacrificial gate in order to define and isolate plural adjacent devices. In association with such a process, portions of the sacrificial gate are removed to form openings that are backfilled with an etch selective dielectric material, i.e., isolation layer, that provides a barrier between adjacent functional gates following removal and replacement of the remaining sacrificial gate material. At advanced nodes, however, notwithstanding recent developments, it remains a challenge to define a gate cut opening with both the desired critical dimension(s) and alignment precision amidst a plurality of densely-arrayed fins.

In comparative structures, misalignment of the gate cut can present a challenging geometry for the conformal deposition of various layers between a fin and the isolation layer filling the gate cut opening adjacent to the fin. Following deposition of a high-k (gate dielectric) layer over the fins, for example, a reliability anneal to improve the properties of the high-k material may include, prior to the annealing step, the deposition of a sacrificial stack of layers, including a conformal layer of titanium nitride over the high-k layer, and the deposition of a layer of amorphous silicon over the layer of titanium nitride.

In misaligned structures where the fin-to-isolation layer distance is less than the design intent, the layer of amorphous silicon may pinch off and incompletely fill the space between the fin and the isolation layer, thus forming a void. The void may trap oxygen that, during the high temperature (e.g., 1000° C.) anneal, causes oxidation of the amorphous silicon and the formation of a layer of silicon dioxide within the void.

Following the anneal, removal of the sacrificial layer of amorphous silicon and the sacrificial layer of titanium nitride may proceed with an initial etching step to strip the native oxide (silicon dioxide) from the surface of the amorphous silicon layer using, for example, a wet etch chemistry including HF, followed by a further etching step to remove the amorphous silicon and the titanium nitride. Hot ammonia, for example, may be used to etch amorphous silicon.

In conjunction with the foregoing process, following removal of the amorphous silicon and the layer of titanium nitride, a residual layer of silicon dioxide formed within one or more voids may remain within the space between the fin and the adjacent isolation layer and interfere with the deposition of layers within that space during subsequent processing. At this stage of processing, an oxide etch suitable to remove the silicon dioxide residue would damage the exposed high-k layer. As such, complete removal of the silicon dioxide layer poses a challenge.

In addition to, or in lieu of the foregoing, misalignment of the gate cut may result in the undesired pinch off of other later-formed layers within the gap between the fin and the isolation layer, such as a work function metal (WFM) layer formed over the fins as part of a functional gate stack.

SUMMARY

Accordingly, it would be beneficial to provide a method for defining a sacrificial gate at critical dimensions with a high degree of accuracy and precision, especially a sacrificial gate that enables formation of a functional replacement metal gate at advanced nodes without altering design rules or otherwise compromising real estate.

As used herein, a "functional gate" refers to a structure used to control output current (i.e., the flow of carriers through a channel) of a semiconductor device using an electrical field or, in some instances, a magnetic field, and includes a gate dielectric and a gate conductor.

Disclosed is a gate cut scheme that may be used in conjunction with a replacement metal gate (RMG) process flow for manufacturing fin field effect transistors (FinFETs) where separate, successive etch steps are used to form a gate cut opening within a masking layer such as an organic planarization layer (OPL) between adjacent fins, i.e., over shallow trench isolation. An isolation layer is formed within the gate cut opening to form a gate cut region. The separate etch steps include forming a recess in the OPL, forming a sacrificial spacer layer over sidewalls of the recess and, using the spacer layer as an etch mask, further etching the OPL to form a gate cut opening.

According to various embodiments, the formation and removal of silicon dioxide residue between the isolation layer and a neighboring fin is avoided by performing the reliability anneal prior to forming the isolation layer. According to various embodiments, pinch-off of a work function metal layer between the isolation layer and a neighboring fin is also avoided by forming the gate cut opening after depositing a first work function metal layer over the fins.

As will be appreciated, the spacer layer can be used to control the critical dimension (CD) of the gate cut opening. Moreover, the spacer layer can be formed directly over the organic planarization layer within the recess aligned with the location of the gate cut opening. With such a construction, erosion of the portion of the OPL supporting the spacer layer can be avoided, which preserves the mechanical integrity of the spacer layer during etching of the OPL.

The disclosed methods can also be implemented for various types of devices, including both short channel and long channel transistors that may be formed simultaneously on the same substrate. According to various embodiments, an inlaid spacer layer formed within a recess aligned with the location of a gate cut opening can be used to form controlled CD isolation layers within each device region.

By way of example, a method of forming a semiconductor structure includes forming a plurality of semiconductor fins over a semiconductor substrate, forming a gate dielectric layer over each of the fins, forming a first work function metal layer over the gate dielectric layer, and forming a masking layer over the first work function metal layer.

The masking layer is etched to form a recess that extends partially through the masking layer and overlies the first work function metal layer between adjacent fins. A spacer layer is then formed over sidewalls of the recess, and the masking layer is etched further using the spacer layer as an etch mask to expose the first work function metal layer at a bottom of the recess. The first work function metal layer and the gate dielectric layer are removed from the bottom of the recess to form a gate cut opening that extends through the masking layer, the first work function metal layer, and the gate dielectric layer. An isolation dielectric layer is then deposited within the gate cut opening.

A further method of forming a semiconductor structure includes forming a plurality of semiconductor fins over a semiconductor substrate, forming a gate dielectric layer over each of the fins, forming a first work function metal layer over the gate dielectric layer, and forming a masking layer over the first work function metal layer.

The masking layer is etched to form a recess extending partially through the masking layer and overlying the first work function metal layer between adjacent fins within first and second device regions of the substrate. A first spacer layer is then formed over sidewalls of the recesses. The method further includes etching the masking layer using the first spacer layer as an etch mask to form a first gate cut opening within the first device region, and a second gate cut opening within the second device region, wherein the first gate cut opening extends partially through the masking layer and the second gate cut opening extending entirely through the masking layer exposing the first work function metal layer at a bottom of the second gate cut opening.

A second spacer layer is then formed over sidewalls of the first and second gate cut openings, and the masking layer is etched further using the second spacer layer as an etch mask to expose the first work function metal layer at a bottom of the first gate cut opening. An isolation dielectric layer is then formed within the first and second gate cut openings.

In further embodiments, a semiconductor structure includes a fin disposed over a semiconductor substrate, a gate stack disposed over the fin, wherein the gate stack includes a gate dielectric layer disposed over the fin and a work function metal layer disposed over the gate dielectric layer, and an isolation layer laterally spaced from the fin and contacting the gate stack, where a void is located in a lower portion of the isolation layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 4A depicts the formation of a spacer layer over sidewalls of the OPL within the recess;

FIG. 4B depicts the formation of the spacer layer over sidewalls of the OPL within the recess;

FIG. 8A shows deposition of a second work function metal layer directly over the high-k layer within the first device region and directly over the first work function metal layer within the second device region, followed by the deposition and planarization of a conductive layer over the second work function metal layer within the first and second device regions;

FIG. 8B shows deposition and chamfering of the second work function metal layer, and the deposition and planarization of a conductive layer over the second work function metal layer;

FIG. 9A shows recessing of the conductive layer and the high-k layer, and the formation and planarization of a self-aligned capping layer over the conductive layer;

FIG. 9B shows recessing of the conductive layer and the high-k layer, and the formation and planarization of a self-aligned capping layer over the conductive layer;

FIG. 10A is a cross-sectional view of an example short channel device according to further embodiments following a high-k reliability anneal, formation of a first work function metal layer over semiconductor fins, and deposition of an organic planarization layer, mask layer and photoresist layer over the first work function metal layer;

FIG. 10B is a cross-sectional view of an example long channel device according to certain embodiments following a high-k reliability anneal, formation of a first work function metal layer over semiconductor fins, and deposition of an organic planarization layer, mask layer and photoresist layer over the first work function metal layer;

FIG. 11A shows the structure of FIG. 10A after the formation of a recess within the OPL over a shallow trench isolation layer (STI) between adjacent fins;

FIG. 11B shows the structure of FIG. 10B after etching of the OPL to form a recess within the OPL within the gate cut region between adjacent fins;

FIG. 12A depicts the formation of a first spacer layer over sidewalls of the OPL within the recess;

FIG. 12B depicts the formation of the first spacer layer over sidewalls of the OPL within the recess;

FIG. 13A shows etching of the OPL for the short channel device using the hard mask and the first spacer layer as an etch mask to form a gate cut opening extending partially through the OPL;

FIG. 13B shows etching of the OPL for the long channel device using the hard mask and the first spacer layer as an etch mask to form a gate cut opening extending entirely through the OPL and exposing the first WFM layer at the bottom of the gate cut opening;

FIG. 14A depicts the formation of a second spacer layer over sidewalls of the OPL within the gate cut opening;

FIG. 14B depicts the formation of the second spacer layer over sidewalls of the OPL within the gate cut opening;

FIG. 17A shows the structure of FIG. 16A following the deposition, planarization and recess etching of an isolation layer within the gate cut opening;

FIG. 17B shows the structure of FIG. 16B following the deposition, planarization and recess etching of an isolation layer within the gate cut opening;

FIG. 18A shows removal of the OPL and removal of the first work function metal layer from the first device region of the short channel device;

FIG. 18B shows removal of the OPL and removal of the first work function metal layer from the second device region of the long channel device;

FIG. 19A shows the deposition and planarization of a conductive layer directly over the gate dielectric layer within the first device region of the short channel device, and the deposition and planarization of the conductive layer directly over the first work function metal layer within the second device region of the short channel device; and FIG. 19B shows the deposition and planarization of a conductive layer directly over the gate dielectric layer within the first device region of the long channel device, and the deposition and planarization of the conductive layer directly over the first work function metal layer within the second device region of the long channel device.

DETAILED DESCRIPTION

Figure 1:
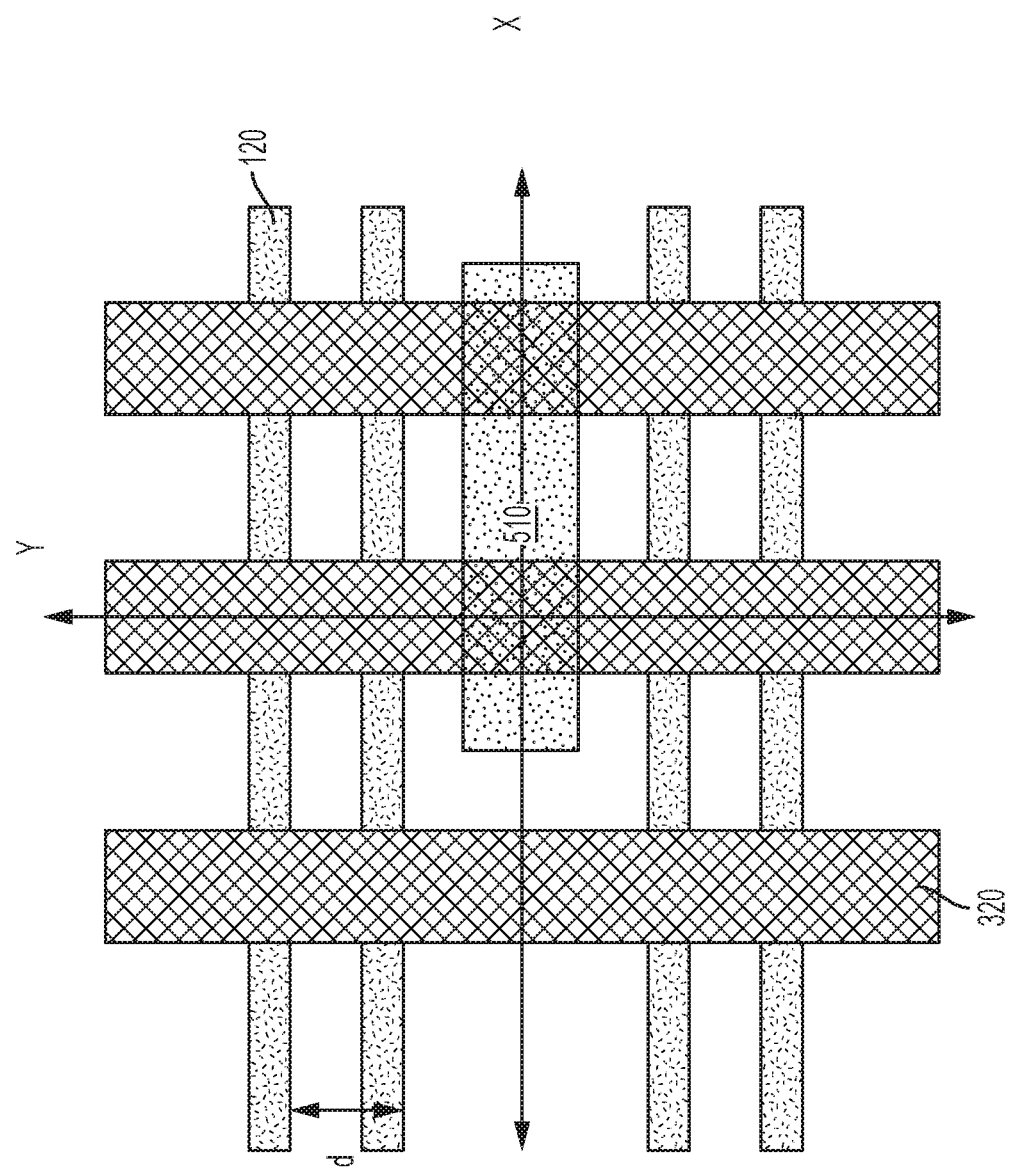
FIG. 1 is a simplified top down plan view schematic diagram of a FinFET architecture according to various embodiments showing the location of a gate cut region between adjacent fins that define first and second device regions.

Reference will now be made in greater detail to various embodiments of the subject matter of the present application, some embodiments of which are illustrated in the accompanying drawings. The same reference numerals will be used throughout the drawings to refer to the same or similar parts.

Disclosed are FinFET device structures and methods of manufacturing FinFET devices, and more particularly methods where the separation of adjacent devices includes the formation of a gate cut opening in a masking layer such as an organic planarization layer (OPL), followed by the deposition of an isolation layer within the gate cut opening. Etching of the OPL to form the gate cut opening includes a first etching step to form a recess within the OPL aligned with the gate cut region, the formation of a spacer layer within the recess on sidewalls thereof, and a second etching step to define the gate cut opening using the spacer layer as an etch mask. In certain embodiments, the spacer layer is formed directly over sidewalls of the recess within the OPL.

In various embodiments, a distance or gap (g) between the sidewall of the isolation layer and an adjacent fin may be less than 20 nm, e.g., 12, 14, 16 or 18 nm, including ranges between any of the foregoing values. Decreasing the distance (g) beneficially impacts the achievable density of devices. However, decreasing the distance (g) between adjacent structures may introduce design and processing challenges. As will be appreciated, such challenges may include the deposition of a functional gate stack, including a gate dielectric layer, gate conductor layer (e.g., work function metal layer) and conductive fill material within the available geometry, e.g., the space between the sidewall of the isolation layer and a neighboring fin. Using the presently-disclosed methods, a structure can be formed having a controlled and consistent distance (g) between the sidewall of an isolation layer and an adjacent fin without altering the design rules for the structure.

A simplified top down plan view schematic diagram of a FinFET architecture is shown in FIG. 1. Plural semiconductor fins 120 are arrayed over a semiconductor substrate (not shown) and a set of sacrificial gates 320 are arranged orthogonal to and straddle the fins 120. A gate cut region 510 is located between a pair of adjacent fins, and identifies the portions of the sacrificial gates 320 that are to be cut. Reference line A is oriented perpendicular to the fin length through a sacrificial gate 320, while reference line B is oriented parallel to a length direction of the fins 120, i.e., across the gates, and is taken through the gate cut region 510 between neighboring fins 120.

Various embodiments related to the formation of FinFET structures are described herein with reference to FIGS. 2-19. A first embodiment is illustrated in connection with FIGS. 2-9, and a second embodiment is illustrated with reference to FIGS. 10-19.

Figure 2B:
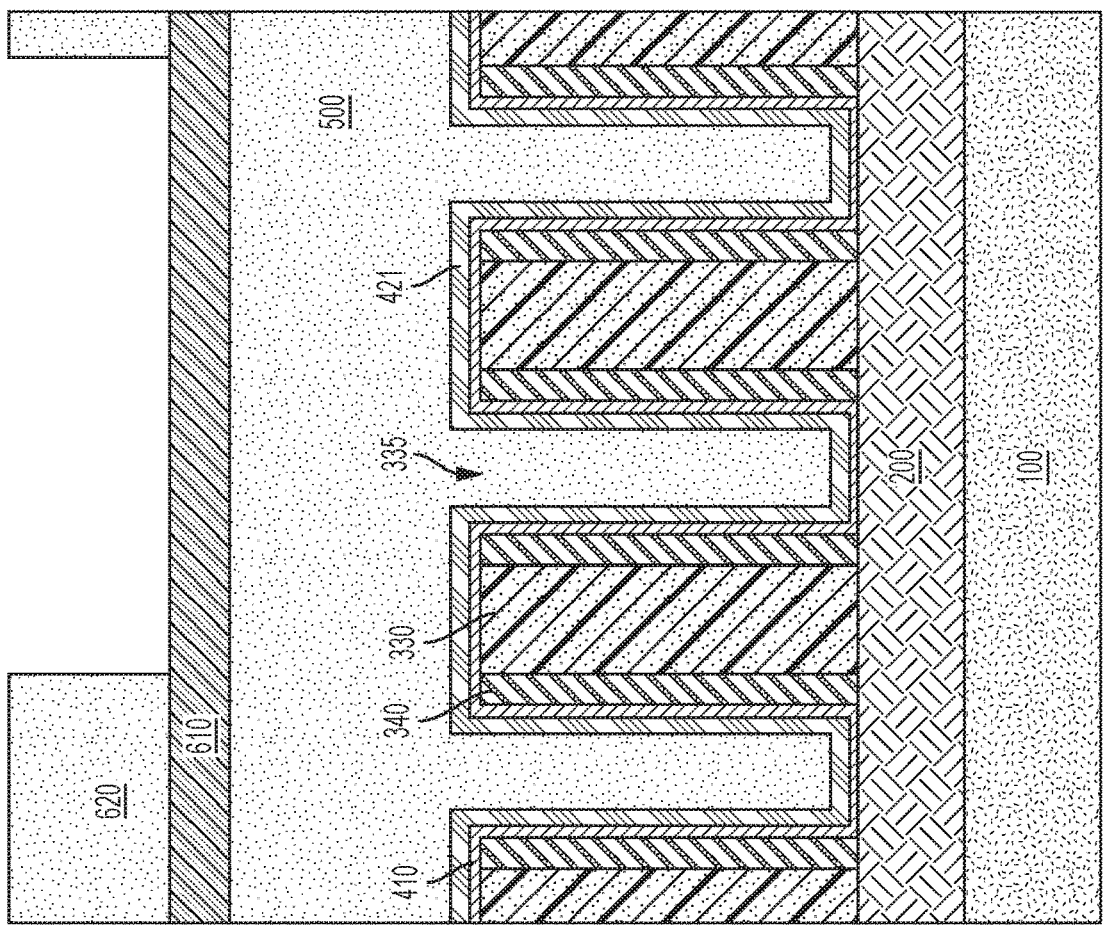
FIG. 2B is a cross-sectional view transverse to the image of FIG. 2A taken between adjacent fins showing an interlayer dielectric, sidewall spacers, the high-k and WFM layers, and the lithography stack including the hard mask and the patterned layer of photoresist formed over the organic planarization layer within a gate cut region.
Figure 2A:
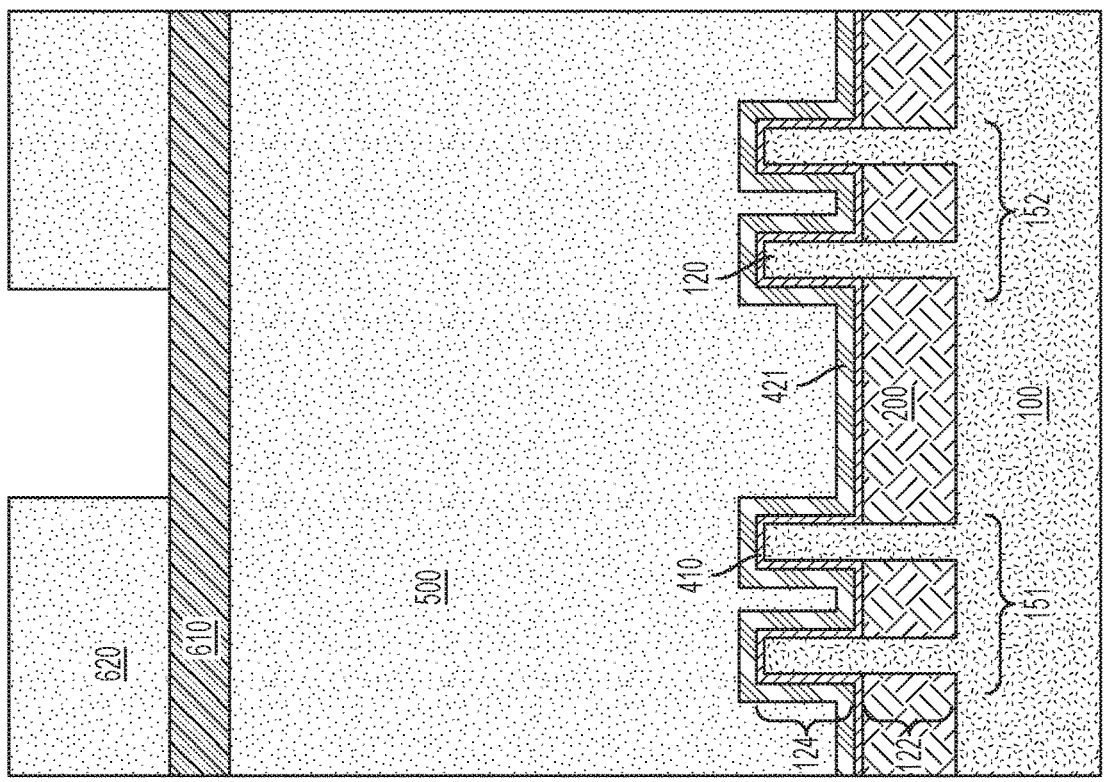
FIG. 2A is a cross-sectional view of a FinFET device at an intermediate stage of fabrication taken normal to a length direction of a fin array showing conformal high-k dielectric and work function metal (WFM) layers formed over the fins, an organic planarization layer (OPL) formed over the high-k and WFM layers, and a lithography stack including a hard mask and a patterned layer of photoresist formed over the organic planarization layer.

Mutually transverse cross-sectional views of a FinFET device at an intermediate stage of fabrication are shown in FIG. 2A and FIG. 2B. FIG. 2A is taken along line A of FIG. 1, while FIG. 2B is taken along line B. The exemplary structure includes a semiconductor substrate 100 and a plurality of semiconductor fins 120 arrayed over the substrate 100.

The semiconductor fins 120 are arranged in parallel and are laterally isolated from each other within a sub-fin region 122 by a shallow trench isolation layer 200. The fins 120 extend above a top surface of the shallow trench isolation layer (STI) layer 200 and define an active device region 124. According to various embodiments, a first group of fins 120 may be configured to form an n-type FET (NFET) within a first device region 151, while a second group of fins 120 may be configured to form a p-type FET (PFET) within a second device region 152.

Substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may include other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that includes, from bottom to top, a handle portion, an isolation layer (e.g., buried oxide layer), and a semiconductor material layer.

Substrate 100 may have dimensions as typically used in the art and may be, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may include (100)-oriented silicon or (111)-oriented silicon, for example.

In various embodiments, fins 120 include a semiconductor material such as silicon, and may be formed by patterning and then etching the semiconductor substrate 100, e.g., a top portion of the semiconductor substrate. In several embodiments, the fins 120 are etched from, and therefore contiguous with the semiconductor substrate 100. For instance, fins 120 may be formed using a sidewall image transfer (SIT) process as known to those skilled in the art.

In certain embodiments, the fins 120 can have a width of 5 nm to 20 nm and a height of 40 nm to 150 nm, although other dimensions are also contemplated. Fins 120 may be arrayed on the substrate at a regular intrafin spacing or pitch (d). As used herein, the term "pitch" refers to the sum of the fin width and the spacing between a pair of adjacent fins. In example embodiments, the fin pitch (d) within a given device region 151, 152 may be within a range of 20 to 100 nm, e.g., 20, 30, 40, 50, 60, 70, 80, 90 or 100 nm, including ranges between any of the foregoing values, although smaller and larger pitch values may be used.

Shallow trench isolation (STI) layer 200 may be used to provide electrical isolation between the fins 120 and between adjacent devices as is needed for the circuit(s) being formed. An STI process for FinFET devices involves creating isolation trenches in the semiconductor substrate 100 through an anisotropic etch process. The isolation trench between each adjacent fin may have a relatively high aspect ratio (e.g., ratio of the depth of the isolation trench to its width). A dielectric filler material, such as silicon dioxide, is deposited into the isolation trenches, for example, using an enhanced high aspect ratio process (eHARP) to fill the isolation trenches. The deposited dielectric material may then be polished by a chemical-mechanical polishing (CMP) process that removes the excess dielectric material and creates a planar STI structure. The planarized oxide is then etched back to form a recessed, uniformly thick oxide isolation layer 200 between the fins 120, where upper sidewalls of the fins 120, i.e., sidewalls within active device region 124, can be exposed for further processing.

As shown in FIG. 2B, an interlayer dielectric (ILD) 330 is deposited over the STI 200 and between fins 120, and openings 335 are formed within the ILD 330, followed by the formation of a sidewall spacer 340 within the openings 335. The ILD layer may include silicon dioxide, and may be formed by chemical vapor deposition (CVD). Openings 335 may be formed using conventional lithography and etching techniques.

Sidewall spacers 340 may be formed by blanket deposition of a spacer material (e.g., using atomic layer deposition) followed by a directional etch such as reactive ion etching (RIE) to remove the spacer material from horizontal surfaces. Suitable sidewall materials for sidewall spacer 340 include oxides, nitrides and oxynitrides, such as silicon dioxide, silicon nitride, silicon oxynitride, and low dielectric constant (low-k) materials such as amorphous carbon, SiOC, SiOCN and SiBCN, as well as a low-k dielectric material. In certain embodiments, the sidewall spacer 340 thickness is 4 to 20 nm, e.g., 4, 10, 15 or 20 nm, including ranges between any of the foregoing values.

The compounds silicon dioxide and silicon nitride have compositions that are nominally represented as $SiO_2$ and $Si_3N_4$, respectively. The terms silicon dioxide and silicon nitride, refer to not only these stoichiometric compositions, but also to oxide and nitride compositions that deviate from the stoichiometric compositions.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

Referring still to FIGS. 2A and 2B, a gate dielectric layer 410 and a first work function metal layer 421 are successively formed over the active device regions 124 of the fins (FIG. 2A) and within the openings 335 over the ILD 330 and sidewall spacers 340 (FIG. 2B).

The gate dielectric layer may be a conformal layer that is formed over exposed surfaces of the fins 120, i.e., directly over the fin sidewalls and top surfaces, and over STI layer 200 between neighboring fins. The gate dielectric layer 410 may be silicon dioxide, silicon nitride, silicon oxynitride, a high-k dielectric, and/or other suitable material.

As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric layer 410 may be deposited by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing values. In various embodiments, the gate dielectric 410 is a composite layer and includes a thin layer (e.g., 0.5 nm) of silicon oxide and an overlying layer of high-k dielectric material.

A first work function metal layer 421 is deposited directly over the gate dielectric layer 410. The first work function metal layer 421 may be a conformal layer that is formed over exposed surfaces following deposition of the gate dielectric. The first work function metal layer 421 can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition. The first work function metal layer 421 thickness may range from 5 nm to 20 nm, e.g., 5, 10, 15 or 20 nm, including ranges between any of the foregoing values.

Referring still to FIGS. 2A and 2B, a masking layer such as an organic planarization layer 500 is formed over the first work function metal layer 421. As shown in FIG. 2B, organic planarization layer 500 overfills openings 335.

The organic planarization layer 500 may be a carbon-based material, such as a layer of amorphous carbon. An organic planarization layer 500 of amorphous carbon may be formed from a gas mixture including a hydrocarbon source and a diluent gas at a deposition temperature of 200° C. to 700° C. Optionally, an as-deposited amorphous carbon (a-C) layer may be cured such as by exposure to UV radiation at a curing temperature greater than 200° C.

Exemplary hydrocarbon compounds that may be included in the hydrocarbon source used to form the amorphous carbon layer may be described by the formula $C_xH_y$, where $1 \leq x \leq 10$ and $2 \leq y \leq 30$. Such hydrocarbon compounds may include, but are not limited to alkanes such as methane, ethane, propane, butane and its isomer isobutane, pentane and its isomers isopentane and neopentane, hexane and its isomers 2-methylpentane, 3-methylpentane, 2,3-dimethylbutane, 2,2-dimethyl butane, and the like; alkenes such as ethylene, propylene, butylene and its isomers, pentene and its isomers, and the like; dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like; and alkynes such as acetylene, propyne, butyne, vinylacetylene and derivatives thereof. Further hydrocarbon compounds include aromatic molecules such as benzene, styrene, toluene, xylene, ethylbenzene, acetophenone, methyl benzoate, phenyl acetate, phenol, cresol, furan, and the like, as well as halogenated aromatic compounds including monofluorobenzene, difluorobenzenes, tetrafluorobenzenes, hexafluorobenzenes and the like.

Suitable diluent gases may include, but are not limited to, hydrogen ($H_2$), helium (He), argon (Ar), ammonia ($NH_3$), carbon monoxide (CO), carbon dioxide ($CO_2$), and mixtures thereof.

According to various embodiments, the masking layer (e.g., OPL 500) is patterned and etched in a sequence of steps to first form a recess, and then form a gate cut opening aligned with the recess. Patterning and etching to form the recess may include forming a lithography stack 600 over the OPL 500. A lithography stack may include one or more of a photoresist layer, an etch stop layer, an amorphous carbon layer, an adhesion layer, an oxide layer, and a nitride layer (not separately shown). Such layers may be configured as known to those skilled in the art to provide a suitable masking layer to pattern and etch the underlying layer(s).

In the illustrated embodiment of FIGS. 2A and 2B, a lithography stack 600 including, from bottom to top, a hard mask 610 and a layer of photoresist 620, is formed over the OPL 500. The hard mask 610 may include titanium oxide, silicon nitride, SiON, or a layer of low temperature oxide, for example. The hard mask 610 may be formed by chemical vapor deposition or atomic layer deposition. The photoresist 620 may include a positive-tone photoresist composition, a negative-tone photoresist composition, or a hybrid-tone photoresist composition. A layer of photoresist material may be formed by a deposition process such as, for example, spin-on coating.

Figure 3B:
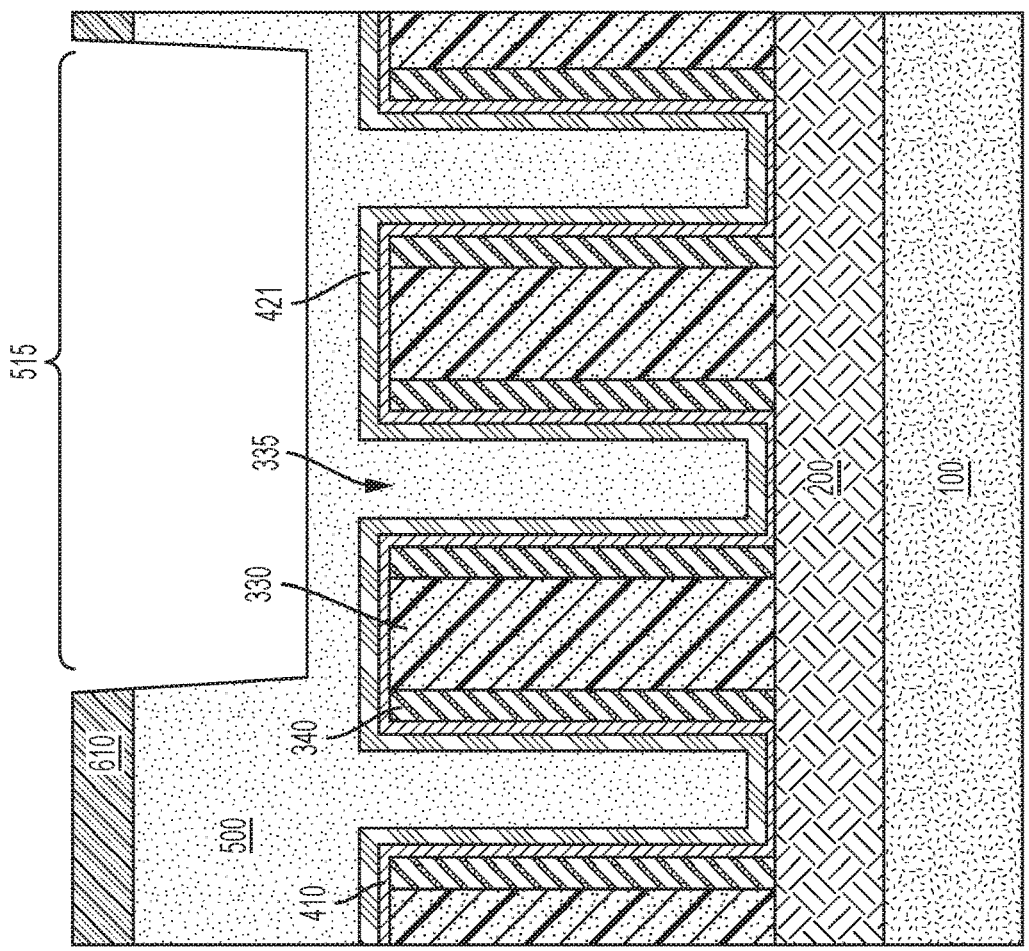
FIG. 3B shows the structure of FIG. 2B after etching of the OPL to form the recess within the OPL within the gate cut region.
Figure 3A:
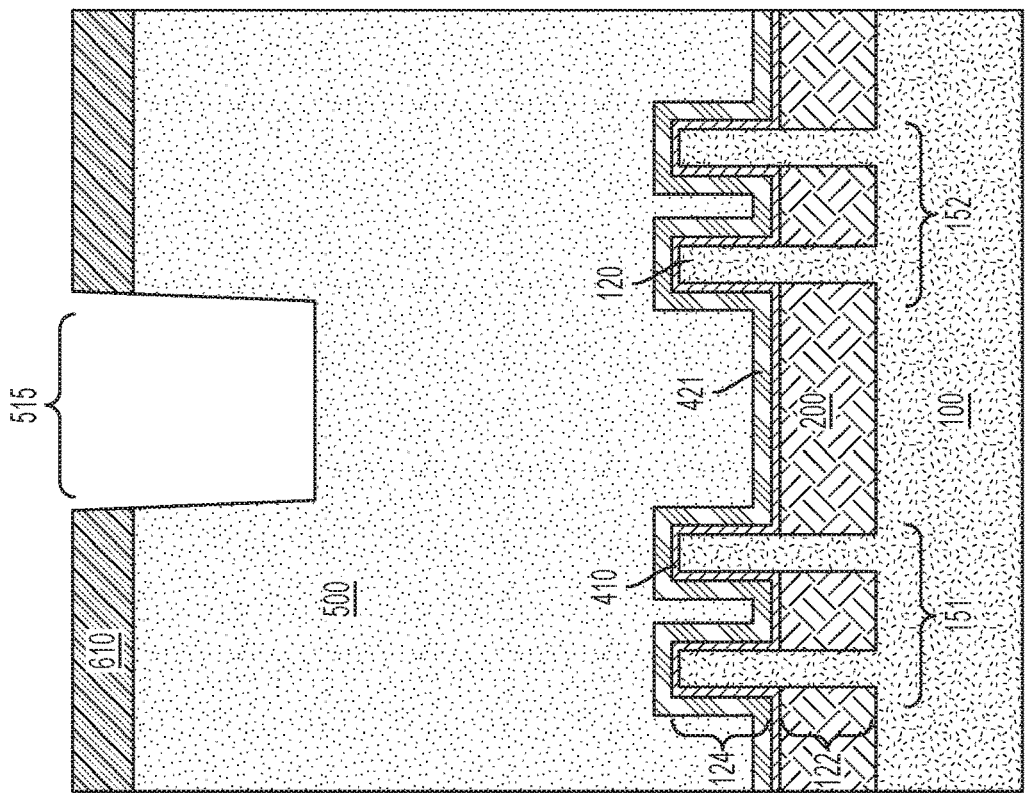
FIG. 3A shows the structure of FIG. 2A after the formation of a recess within the OPL over a shallow trench isolation layer (STI) between fins.

The deposited photoresist is subjected to a pattern of irradiation, and the exposed photoresist material is developed utilizing a conventional resist developer. Referring to FIGS. 3A and 3B, the pattern provided by the patterned photoresist material is transferred through the hard mask 610 and partially into the OPL layer 500 to form a recess 515. According to various embodiments, the areal dimensions of the recesses 515 are within lithography process windows for forming such structures. The OPL layer 500 defines the bottom surface of each recess 515.

The pattern transfer etching process to form recess 515 is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

Referring to FIG. 4A and FIG. 4B, a spacer layer 520 is formed within the recess 515 over exposed sidewalls of the OPL. That is, the spacer layer 520 is deposited directly over the OPL 500. The spacer layer 520 may include a layer of titanium oxide, silicon dioxide or silicon nitride, for example, and may be used to control, i.e., decrease, the critical dimension (length and/or width) of the recess and hence a later-formed gate cut opening. A thickness of the spacer layer 520 may be 3 to 6 nm, for example. In various embodiments, the spacer layer 520 is deposited as a conformal layer over the structure of FIG. 3A and FIG. 3B, followed by an anisotropic etch to remove the spacer layer material from horizontal surfaces.

Figure 5B:
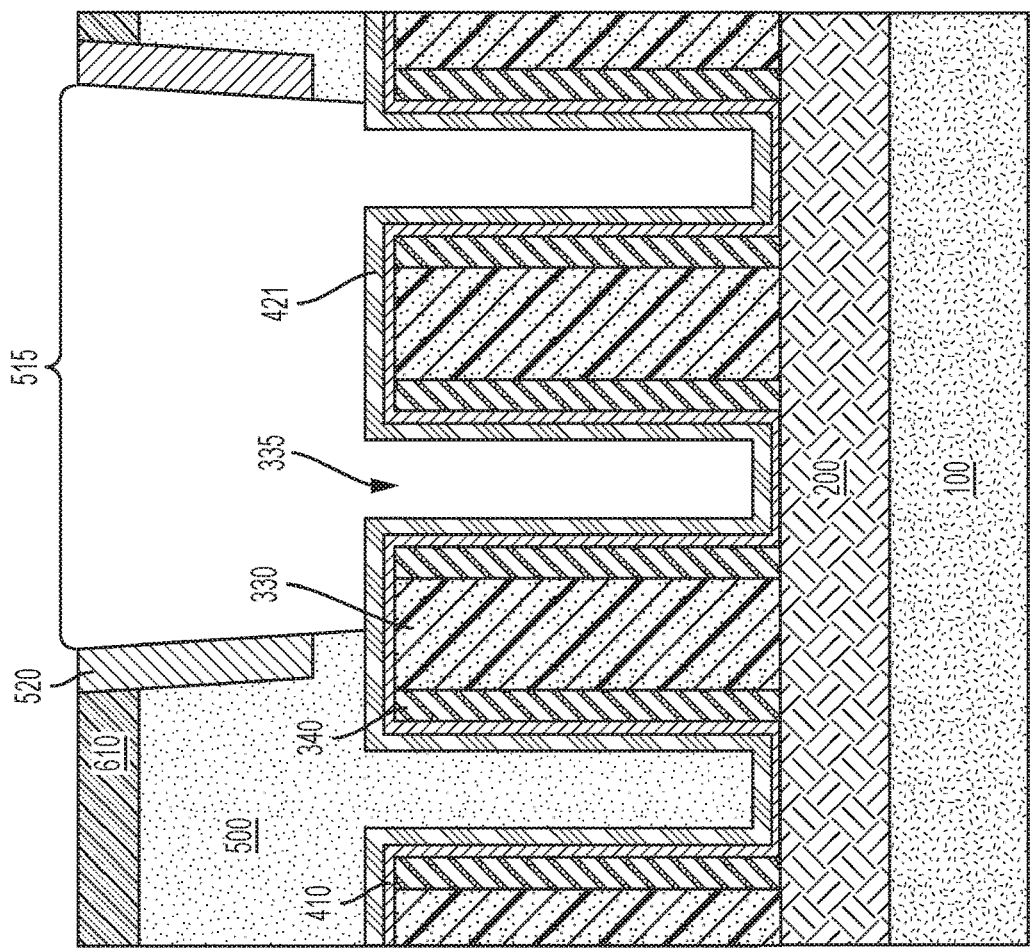
FIG. 5B shows etching of the OPL using the spacer layer as an etch mask to form a gate cut opening exposing the first WFM layer.
Figure 5A:
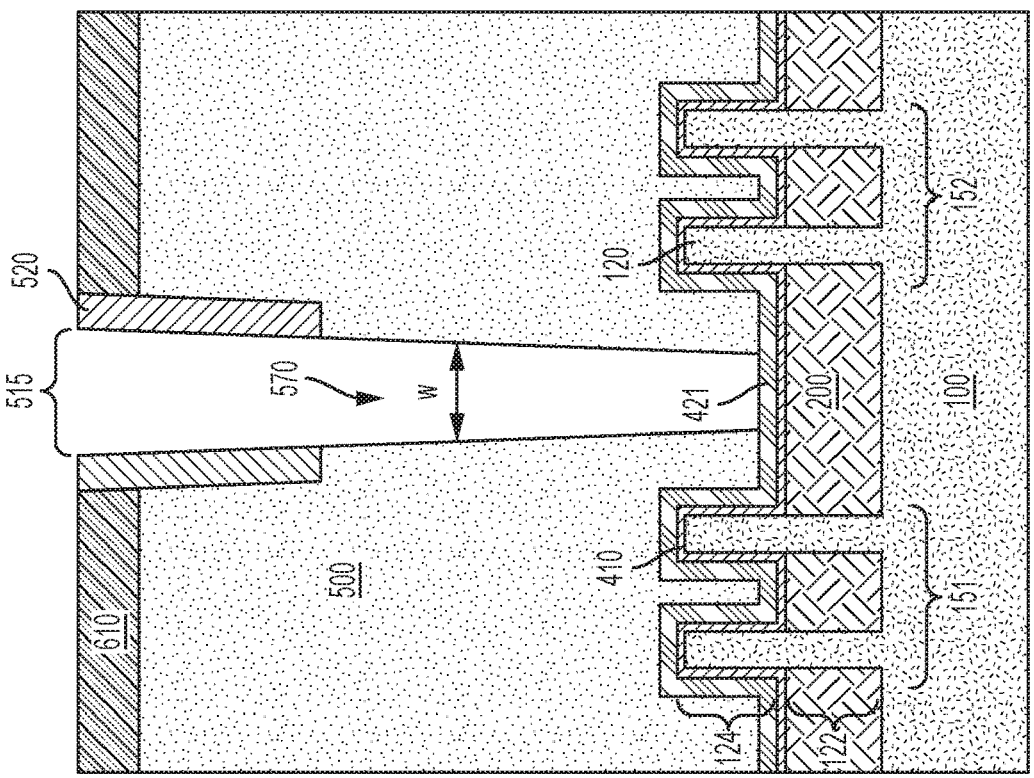
FIG. 5A shows etching of the OPL using the hard mask and the spacer layer as an etch mask to form a gate cut opening exposing a top surface of the first WFM layer over STI between fins.

Referring to FIG. 5A and FIG. 5B, using the hard mask 610 and the spacer layer 520 as an etch mask, a gate cut opening 570 is etched into the OPL 500. In certain embodiments, the spacer layer 520 is adapted to function as a sacrificial masking layer that, in conjunction with an anisotropic etch of the OPL 500, defines the areal dimensions of the gate cut opening 570.

A gate cut opening 570 may have areal dimensions (length and width) that independently range from 10 to 40 nm, e.g., 10, 15, 20, 25, 30, 35 or 40 nm, including ranges between any of the foregoing values, although lesser and greater dimensions may be used. Along a dimension orthogonal to a length direction of the fins (FIG. 5A), a lateral dimension (w) of the gate cut opening 570 is defined by the spacer layer 520, such that the gate cut opening 570 may be defined with substantially vertical sidewalls. As used herein, "substantially vertical" sidewalls deviate from a direction normal to a major surface of the substrate by less than 5°, e.g., 0, 1, 2, 3, 4, or 5°, including ranges between any of the foregoing values. In certain embodiments, the width (w) of the gate cut opening 570 is less than 20 nm, e.g., 5, 10 or 15 nm.

During etching of the OPL 500 to form the gate cut opening 570, the OPL material adjacent to the gate cut opening 570 is protected by the overlying hard mask 610 and the spacer layer 520 and therefore the OPL material adjacent to the gate cut opening, i.e., overlying fins 120, can mechanically support the spacer layer 520.

Figure 6B:
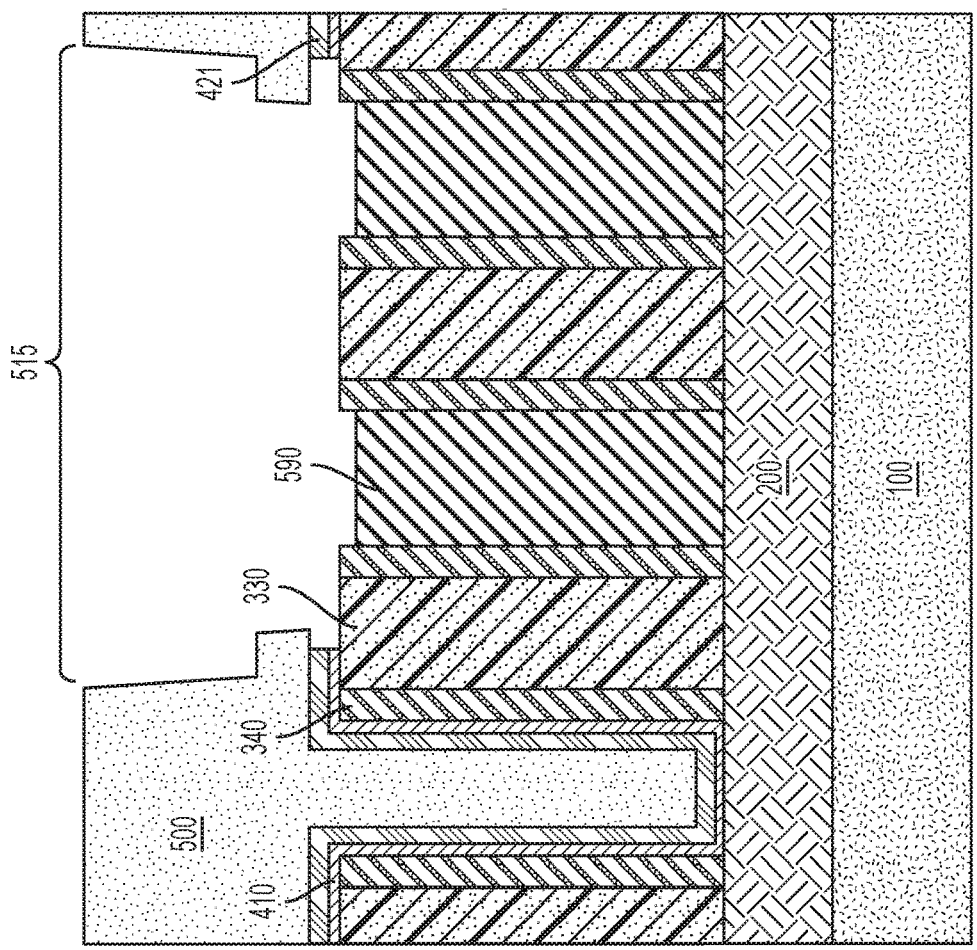
FIG. 6B shows the structure of FIG. 5B following removal of exposed portions of the first work function metal layer and high-k layer, and the deposition, planarization and recess etching of the isolation layer within the gate cut opening.
Figure 6A:
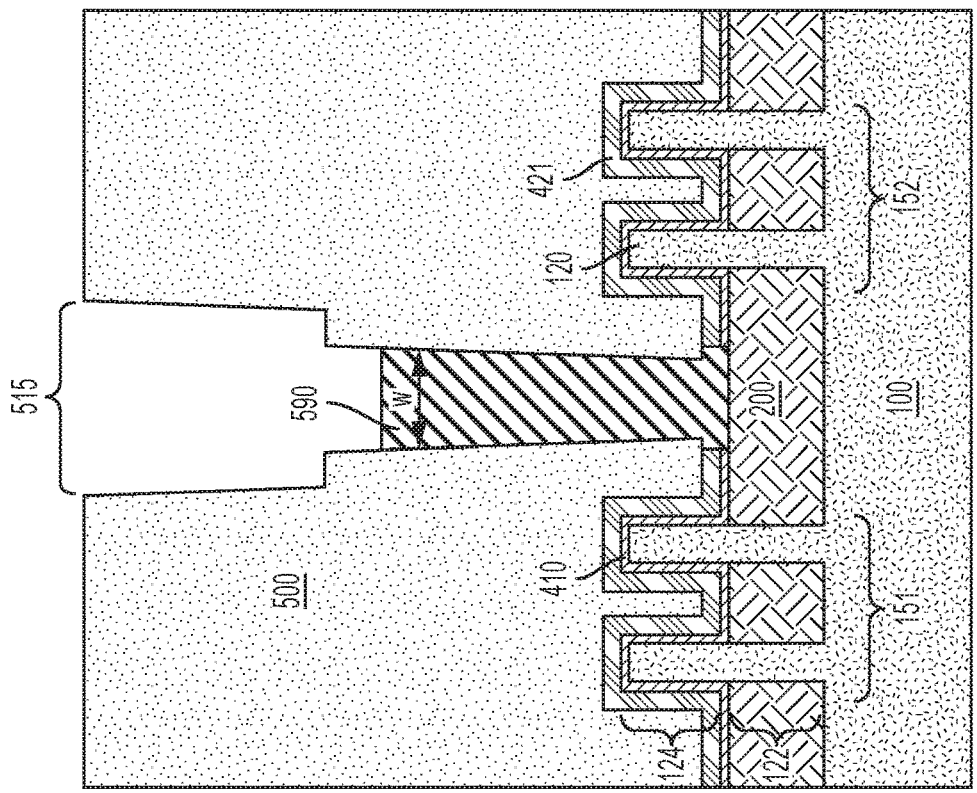
FIG. 6A shows the structure of FIG. 5A following removal of exposed portions of the first work function metal layer and high-k layer, and after the deposition, planarization and recess etching of an isolation layer within the gate cut opening.

Referring to FIG. 6A and FIG. 6B, during or after removal of the gate dielectric layer 410 and the first work function metal layer 421 at the bottom of the gate cut opening 570, the spacer layer 520 and the hard mask 610 are removed using a selective etch. An isolation layer 590 is then deposited within self-aligned locations within gate cut openings 570. The isolation layer 590 extends along a length of the fins. The isolation layer 590 may include a dielectric material such as SiCO, SiCN, SiOCN, and the like, and may be formed by atomic layer deposition (ALD). According to various embodiments, the isolation layer 590 and the OPL 500 are formed from materials that can be etched selectively with respect to each other. As shown in FIGS. 6A and 6B, a selective etch of the isolation layer 590 may be used to recess the isolation layer within the gate cut opening 570.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

Figure 7B:
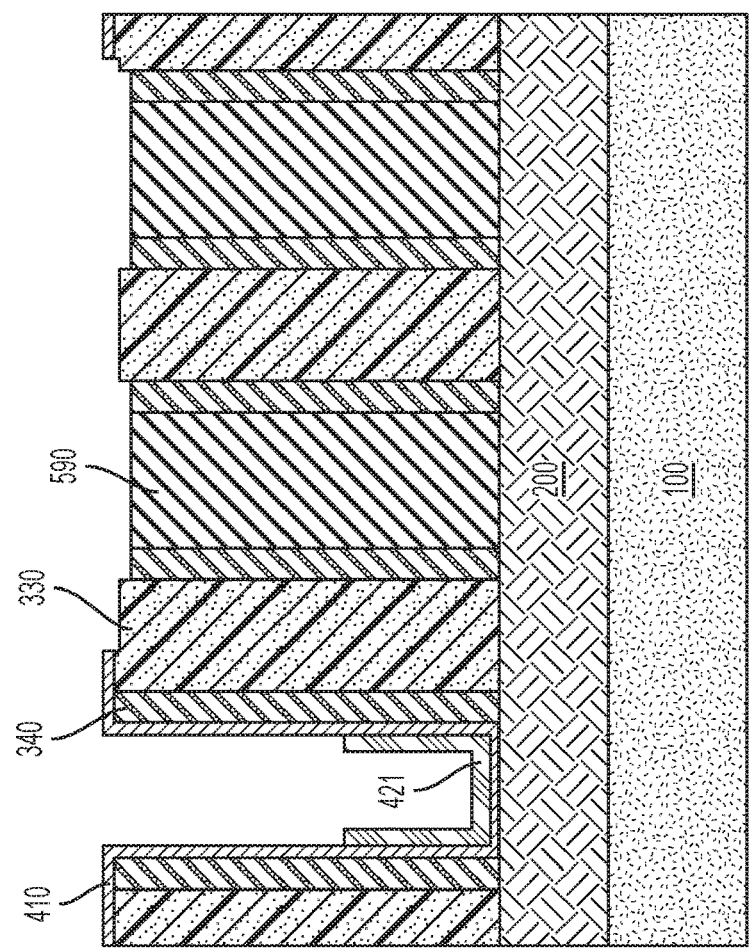
FIG. 7B shows removal of the OPL and chamfering of the first work function metal layer within a second device region.
Figure 7A:
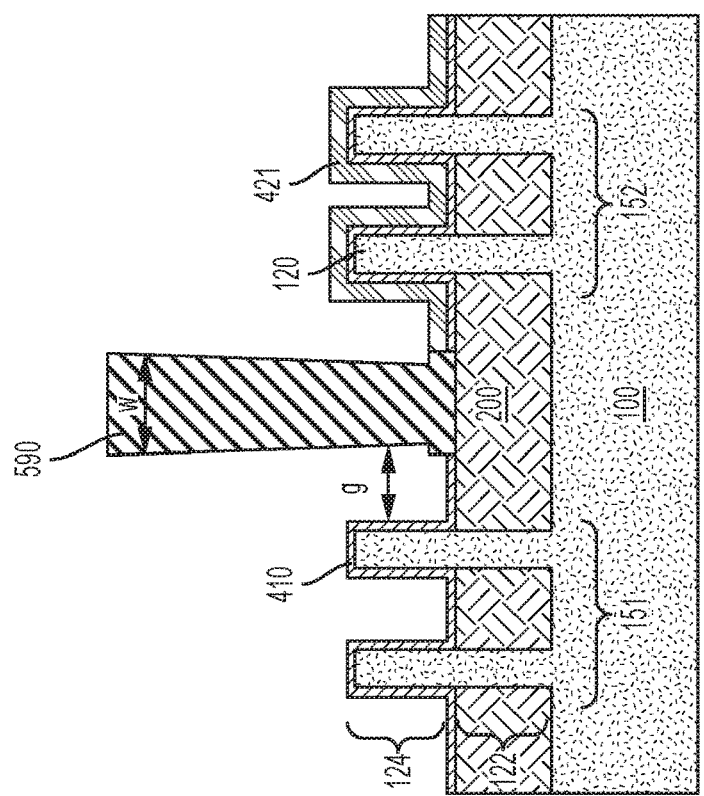
FIG. 7A depicts removal of the OPL and removal of the first work function metal layer from over the fins within a first device region.

Referring to FIG. 7A and FIG. 7B, following removal of the OPL to expose sidewalls of the isolation layer 590 and the first work function metal layer 421, conventional lithography and etching techniques can be used to remove the first work function metal layer 421 from over the fins 120 within first device region 151 (FIG. 7A), while within the second device region 152, portions of the first work function metal layer 421 are etched to expose the gate dielectric layer 410 along upper regions of the opening 335 not filled with isolation layer 590 (FIG. 7B). The OPL 500 can be removed, for example, by ashing.

Referring to FIG. 8A and FIG. 8B, according to certain embodiments, a second work function metal layer 422 is formed over fins 120 within first and second device regions 151, 152. Within the first device region 151, second work function metal layer 422 is formed directly over the gate dielectric layer 410. Within the second device region 152, second work function metal layer 422 is formed directly over the first work function metal layer 421. The materials and methods used to form the first work function metal layer 421 can be used to form the second work function metal layer 422. The second work function metal layer 422 thickness may range from 5 nm to 20 nm, e.g., 5, 10, 15 or 20 nm, including ranges between any of the foregoing values.

Gate contact metallization 480 is formed directly over the exposed work function metal layer within each device region 151, 152 and polished using, for example, chemical mechanical polishing to form a planarized structure. The gate contact metallization 480 may include tungsten and may be formed using chemical vapor deposition.

"Planarization" and "planarize" as used herein refer to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Following deposition and planarization of the metal gate 480, shown in FIG. 9A and FIG. 9B is the structure of FIG. 8A and FIG. 8B after a recess etch of the metal gate 480, such that a top surface of the metal gate 480 is below a top surface of the isolation layer 590, and the formation and planarization of a self-aligned capping (SAC) layer 700 over the metal gate. The capping layer 700 may include silicon nitride, and may be formed by chemical vapor deposition.

The foregoing method of forming a semiconductor structure includes forming a plurality of semiconductor fins 120 over a semiconductor substrate 100, forming a gate dielectric layer 410 over each of the fins, forming a first work function metal layer 421 over the gate dielectric layer 410, forming a masking layer 500 over the first work function metal layer 421, etching the masking layer 500 to form a recess 515 extending partially through the masking layer 500 and overlying the first work function metal layer 421 between adjacent fins, forming a spacer layer 520 over sidewalls of the recess 515, etching the masking layer 500 using the spacer layer 520 as an etch mask to form a gate cut opening 570 and expose the first work function metal layer 421 at a bottom of the gate cut opening 570, etching the first work function metal layer 421 and the gate dielectric layer 410 at the bottom of the gate cut opening 570, and depositing an isolation dielectric layer 590 within the gate cut opening 570.

A further embodiment is now illustrated with reference to FIGS. 10-19. FIG. 10A and FIG. 10B are cross-sectional views of an example short channel device and an example long channel device, respectively, at an intermediate stage of fabrication and formed on the same substrate following a high-k reliability anneal of gate dielectric layer 410, formation of a first work function metal layer 421 over semiconductor fins 120, and deposition of an organic planarization layer 500, mask layer 610 and photoresist layer 620 over the first work function metal layer 421.

Referring to FIG. 10B, and in accordance with various embodiments, portions of the fins 120 for the long channel device may be coated with a thin conformal oxide layer prior to forming the gate dielectric 410. The thin conformal oxide layer is referred to herein as an extended gate or EG oxide layer 405. The EG oxide layer 405 may include silicon dioxide, for example, and may be formed over the fins within the active device region 124. The EG oxide layer 405 may have a thickness of 2 to 3 nm. During the course of manufacturing the FinFET device, the EG oxide 405 may be stripped from source and drain regions of the fins and/or channel regions of the fins.

As will be appreciated, in certain embodiments the density of structures (e.g., fins) formed over the substrate 100 for the short channel device (FIG. 10A) may be greater than the density of structures formed over the substrate 100 for the long channel device (FIG. 10B) resulting in local variability in the OPL thickness, i.e., a greater OPL thickness over the short channel device. In certain embodiments, the OPL thickness over the short channel device may be 10 to 100% greater than the OPL thickness over the long channel device, e.g., 10, 20, 40, 50 or 100% greater, including ranges between any of the foregoing values.

Local differences in the thickness of the OPL may pose a challenge to achieve global planarization of the OPL, e.g., using chemical mechanical polishing. Moreover, local differences in the thickness of the OPL overburden may also complicate uniform etching and achieving CD control of respective gate cut openings within short and long channel device regions. Applicant has shown that the CD for a gate cut opening for a long channel device may be significantly larger than the CD for a gate cut opening for a short channel device because the duration of an etching step used to simultaneously form gate cut openings in each device region is correlated to the thickness of the (thicker) OPL within the short channel device region, which may result in over-etching of the (thinner) OPL within the long channel device region. In the present embodiment, the undesired over-etching of the OPL within one or more device regions may be controlled using an inlaid spacer layer.

As in the previous embodiment, the photoresist layer 620 is patterned using conventional lithography and etching techniques and, referring also to FIGS. 11A and 11B, the pattern provided by the patterned photoresist is transferred through the hard mask 610 and partially into the OPL layer 500 to form recesses 515. The photoresist layer is then removed.

Referring to FIG. 12A and FIG. 12B, a first spacer layer 520 is formed within the recesses 515 over exposed sidewalls of the OPL. In various embodiments, the first spacer layer 520 is deposited as a conformal layer over the structure of FIG. 11A and FIG. 11B, followed by an anisotropic etch to remove the first spacer layer material from horizontal surfaces.

The first spacer layer 520 may include a layer of titanium oxide, silicon dioxide or silicon nitride, for example, and may be used to control, i.e., decrease, the critical dimension (length and/or width) of the recesses 515 and hence the later-formed gate cut opening. A thickness of the first spacer layer 520 may be 3 to 6 nm, for example.

Referring to FIG. 13A and FIG. 13B, using the hard mask 610 and the first spacer layer 520 as an etch mask, a gate cut opening 570 is etched into the OPL 500. As will be appreciated, the first spacer layer 520 is adapted to function as a sacrificial masking layer that, in conjunction with an anisotropic etch of the OPL 500, defines the areal dimensions of the gate cut opening 570.

In the illustrated embodiment, for the short channel device (FIG. 13A) the gate cut opening 570 extends only partially through the OPL 500, while for the long channel device (FIG. 13B) the gate cut opening extends entirely through the (thinner) OPL 500 to expose the first work function metal layer 421 at the bottom of the gate cut opening 570.

Referring to FIG. 14A and FIG. 14B, a second spacer layer 530 is then formed within the gate cut opening 570 over exposed sidewalls of the first space layer 520 and OPL 500 in each of the first and second device regions. In various embodiments, the second spacer layer 530 is deposited as a conformal layer over the structure of FIG. 13A and FIG. 13B, and an anisotropic etch is used to remove the second spacer layer material from horizontal surfaces.

The second spacer layer 530 may include a layer of titanium oxide, silicon dioxide or silicon nitride, for example, and may be used to define a critical dimension (length and/or width) during further etching of the gate cut opening for the short channel device, and inhibit etching of the OPL within the gate cut opening of the long channel device. A thickness of the second spacer layer 530 may be 3 to 6 nm, for example.

Figures 15A, 15B:
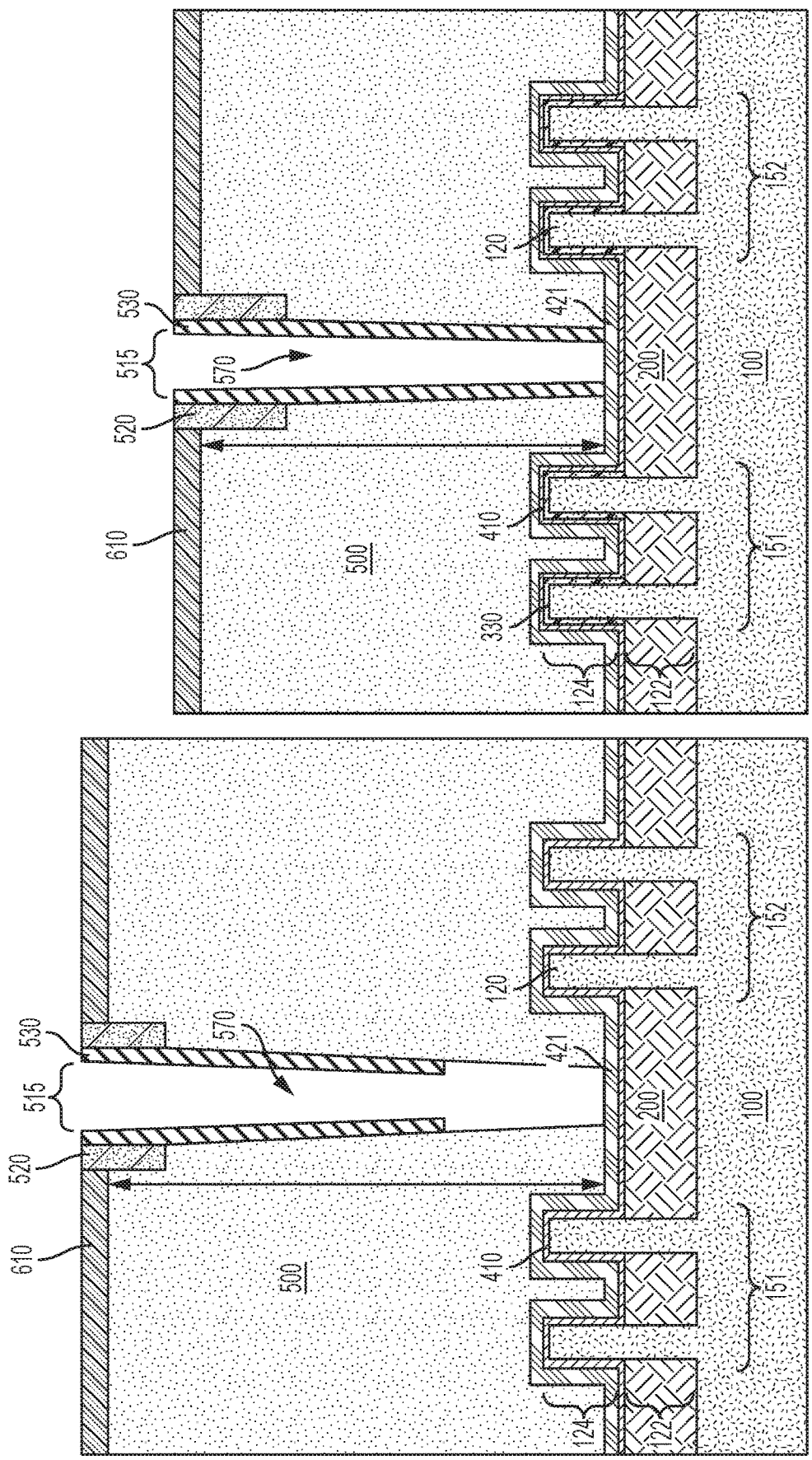
FIG. 15A shows further etching of the OPL for the short channel device using the second spacer layer as an etch mask to form a gate cut opening exposing the first WFM layer.
FIG. 15B shows the gate cut opening for the long channel device following further etching of the OPL for the short channel device.

Referring to FIG. 15A and FIG. 15B, a further anisotropic etch of the OPL for the short channel device, i.e., using the hard mask 610 and the second spacer layer 530 as an etch mask, is used to expose the first work function metal layer 421 at the bottom of the gate cut opening. As shown in FIG. 15A, further etching of the OPL may result in a step change in the thickness of the gate cut opening 570 proximate to a lower end of the second spacer layer 530, such that a lower portion of the gate cut opening is wider than an upper portion of the gate cut opening. During the additional etching step used to form the gate cut opening for the short channel device, the second spacer layer 530 prevents further etching of the OPL within the long channel device region (FIG. 15B). That is, the second spacer layer 530 anchors the CD for the long channel device.

Figure 16A:
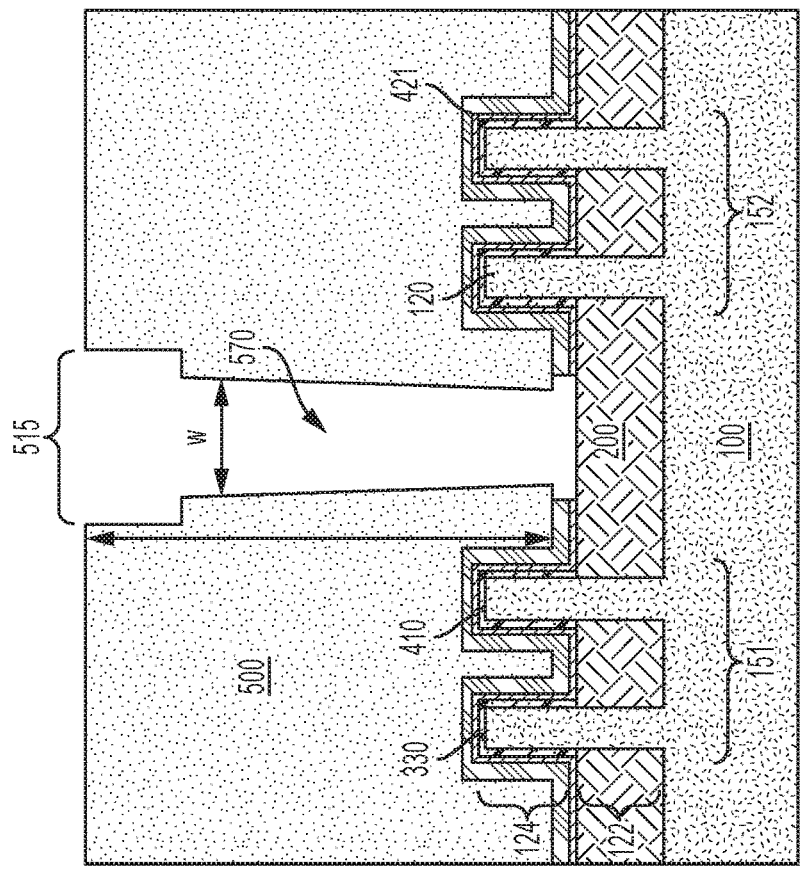
FIG. 16A depicts removal of the hard mask, first and second spacer layers, and removal of the first work function metal layer and high-k layer within the gate cut opening for the short channel device prior to filling the gate cut opening.
Figure 16B:
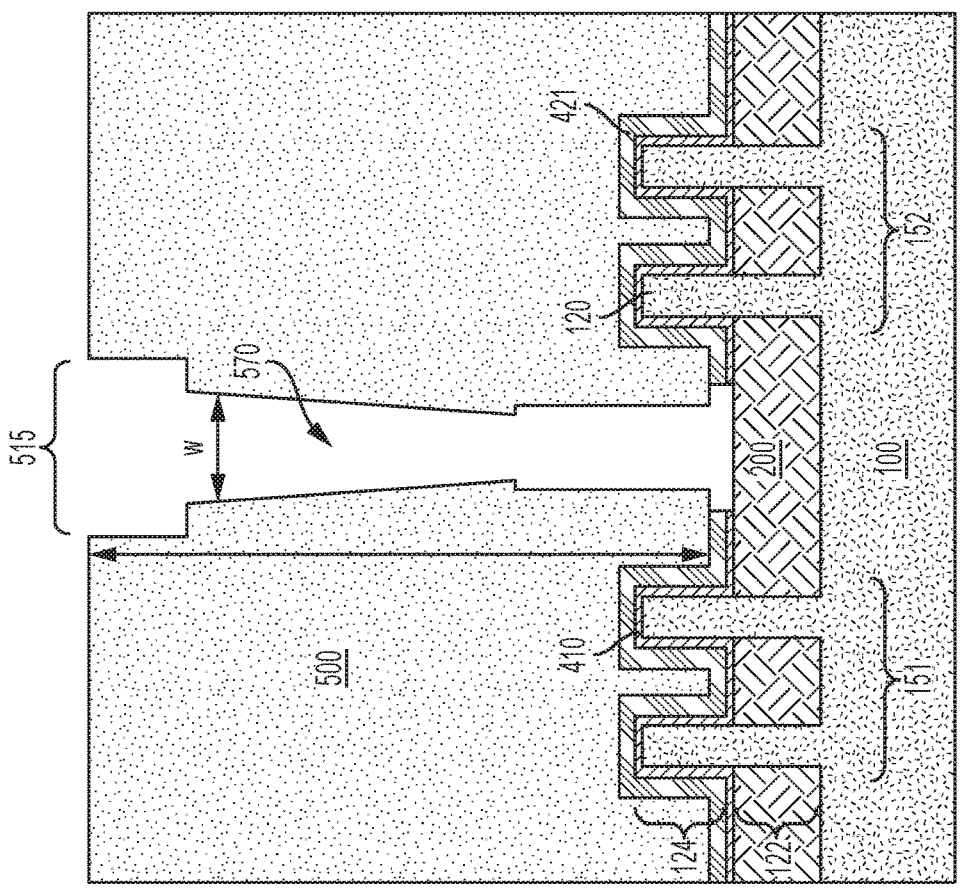
FIG. 16B depicts removal of the hard mask, first and second spacer layers, and removal of the first work function metal layer and high-k layer within the gate cut opening for the long channel device prior to filling the gate cut opening.

Referring to FIG. 16A and FIG. 16B, following removal of the hard mask 610, second spacer layer 530 and first spacer layer 520, gate cut openings 570 may have areal dimensions (length and width) that independently range from 10 to 40 nm, e.g., 10, 15, 20, 25, 30, 35 or 40 nm, including ranges between any of the foregoing values, although lesser and greater dimensions may be used. Along a dimension orthogonal to a length direction of the fins, a lateral dimension (w) of the gate cut opening 570 may be defined with substantially vertical sidewalls. In certain embodiments, the width (w) of a gate cut opening 570 is less than 20 nm, e.g., 5, 10 or 15 nm.

In accordance with various embodiments, the sidewall spacers 520, 530 prevent lateral etching of the OPL within the gate cut openings, which can be used to control the CD of the gate cut openings for both long and short channel devices.

Referring to FIG. 17A and FIG. 17B, an isolation layer 590 is deposited within self-aligned locations within gate cut openings 570 for each of the short channel and the long channel devices. As in previous embodiments, the isolation layer 590 extends along a length of the fins, and may include a dielectric material such as SiCO, SiCN, SiOCN, and the like, and may be formed by atomic layer deposition (ALD). For the short channel device (FIG. 17A), because a lower portion of the gate cut opening 570 is unprotected by the second spacer layer 530 during the additional etching step, the lower portion of the gate cut opening may be wider than an upper portion of the gate cut opening and, for such a geometry, the isolation layer may pinch off leaving a void 591 in the lower portion of the isolation layer 590. As used herein, a "lower portion" of the isolation layer refers to a lower 50% of a height of the isolation layer 590, and may include portions of the isolation layer disposed below a height of adjacent fins. An "upper portion" of the isolation layer refers to the upper 50% of a height of the isolation layer 590, According to various embodiments, the isolation layer 590 and the OPL 500 are formed from materials that can be etched selectively with respect to each other. Thus, as shown in FIGS. 17A and 17B, a selective etch of the isolation layer 590 may be used to recess the isolation layer within the gate cut opening 570.

Referring to FIG. 18A and FIG. 18B, OPL 500 can be removed, for example, by ashing to expose the isolation layer 590. Within each first device region 151, conventional lithography and etching techniques can be used to remove the first work function metal layer 421 from over the fins 120. At this stage of processing, an additional work function metal layer (not separately shown) may be formed over the gate dielectric within first device regions 151 and/or within second device regions 152.

Referring to FIG. 19A and FIG. 19B, gate contact metallization 480 is formed directly over the work function metal layer(s) within each device region 151, 152 and polished using, for example, chemical mechanical polishing to form a planarized structure. The gate contact metallization 480 may include tungsten and may be formed using chemical vapor deposition. As in the previous embodiment, a self-aligned capping layer may be formed over the gate metallization 480.

The gate isolation methods and structures described herein leverage the formation of a spacer layer within a recess formed in an organic planarization layer, which enables precise alignment of the cut region of a sacrificial gate. By forming the isolation layer after a reliability anneal of the gate dielectric and after formation of a first work function metal layer, both the desired critical dimension (CD) and alignment of the isolation layer can be achieved. The disclosed methods enable structures that are compatible with both long channel and short channel devices, including long and short channel devices formed on the same substrate.

As described herein, the formation or deposition of a layer or structure, including the foregoing layers and structures, may involve one or more techniques suitable for the material or layer being deposited or the structure being formed. In addition to techniques or methods specifically mentioned, various techniques include, but are not limited to, chemical vapor deposition (CVD), low-pressure chemical vapor deposition (LPCVD), plasma enhanced chemical vapor deposition (PECVD), microwave plasma chemical vapor deposition (MPCVD), metal organic CVD (MOCVD), atomic layer deposition (ALD), molecular beam epitaxy (MBE), electroplating, electroless plating, ion beam deposition, spin-on coating, thermal oxidation, and physical vapor deposition (PVD) techniques such as sputtering or evaporation.

As used herein, the singular forms "a," "an" and "the" include plural referents unless the context clearly dictates otherwise. Thus, for example, reference to a "work function metal layer" or "spacer layer" includes examples having two or more such "work function metal layers" or "spacer layers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an isolation layer that comprises silicon dioxide include embodiments where an isolation layer consists essentially of silicon dioxide and embodiments where an isolation layer consists of silicon dioxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor structure, comprising:
    forming a plurality of semiconductor fins over a semiconductor substrate;
    forming a gate dielectric layer over each of the fins;
    forming a first work function metal layer over the gate dielectric layer;
    forming a masking layer over the first work function metal layer;
    a first etching of the masking layer to form a plurality of recesses extending partially through the masking layer, a first recess of the plurality of recesses overlying the first work function metal layer between adjacent fins within a first device region of the substrate, and a second recess of the plurality of recesses overlying the first work function metal layer between adjacent fins within a second device region of the substrate;
    forming a first spacer layer over sidewalls of the plurality of recesses;
    a second etching of the masking layer using the first spacer layer as a first etch mask to form a first gate cut opening within the first device region and a second gate cut opening within the second device region, wherein the first gate cut opening extends partially through the masking layer and the second gate cut opening extending entirely through the masking layer exposing the first work function metal layer at a first bottom of the second gate cut opening;
    forming a second spacer layer over sidewalls of the first and second gate cut openings;
    a third etching of the masking layer using the second spacer layer as a second etch mask to expose the first work function metal layer at a first bottom of the first gate cut opening;
    etching the first work function metal layer from the first bottom of the first and second gate cut openings and etching the gate dielectric layer thereunder, thereby forming a second bottom of the first gate cut opening and a second bottom of the second gate cut opening; and
    depositing an isolation dielectric layer within the first and second gate cut openings.

2. The method of claim 1, wherein a thickness of the masking layer in the first device region is greater than a thickness of the masking layer in the second device region.

3. The method of claim 1, further comprising removing the first and second spacer layers prior to depositing the isolation dielectric layer.

4. The method of claim 1, wherein a lower portion of the first gate cut opening is wider than an upper portion of the first gate cut opening.

5. The method of claim 1, wherein the second bottom of the first gate cut opening has a width that is greater than a width of the first bottom of the first gate cut opening, and the second bottom of the second gate cut opening has a width that is greater than a width of the first bottom of the second gate cut opening.

\* \* \* \* \*